United States Patent
Sakuma et al.

(10) Patent No.: US 9,496,516 B2
(45) Date of Patent: Nov. 15, 2016

(54) ORGANIC LIGHT-EMITTING ELEMENT, LIGHT SOURCE DEVICE AND METHOD OF MANUFACTURING ORGANIC LIGHT-EMITTING ELEMENT

(75) Inventors: Hirotaka Sakuma, Tokyo (JP); Sukekazu Aratani, Tokyo (JP); Shunichiro Nobuki, Tokyo (JP); Shingo Ishihara, Tokyo (JP)

(73) Assignee: Hitach, Ltd., Tokyo (JP)

( * ) Notice: Subject to any disclaimer, the term of this patent is extended or adjusted under 35 U.S.C. 154(b) by 421 days.

(21) Appl. No.: 14/233,628

(22) PCT Filed: Jul. 3, 2012

(86) PCT No.: PCT/JP2012/066996
§ 371 (c)(1),
(2), (4) Date: Jan. 17, 2014

(87) PCT Pub. No.: WO2013/011833
PCT Pub. Date: Jan. 24, 2013

(65) Prior Publication Data
US 2014/0151678 A1    Jun. 5, 2014

(30) Foreign Application Priority Data

Jul. 19, 2011  (JP) ................................ 2011-157417
Jul. 19, 2011  (JP) ................................ 2011-157418

(51) Int. Cl.
*H01J 1/62*     (2006.01)
*H01L 51/52*    (2006.01)
(Continued)

(52) U.S. Cl.
CPC ....... *H01L 51/5203* (2013.01); *H01L 51/0012* (2013.01); *H01L 51/5271* (2013.01); *H01L 51/5275* (2013.01); *H01L 51/56* (2013.01); *H01L 51/0087* (2013.01)

(58) Field of Classification Search
CPC ..................... H01L 51/5012; H01L 27/3244
USPC ......................... 313/504, 506, 498
See application file for complete search history.

(56) References Cited

U.S. PATENT DOCUMENTS

2002/0061418 A1    5/2002  Imanishi
2002/0105005 A1    8/2002  Seo et al.
(Continued)

FOREIGN PATENT DOCUMENTS

EP    1187235 A2    3/2002
JP    11-102783 A   4/1999
(Continued)

OTHER PUBLICATIONS

Taiwanese Office Action, for Taiwanese Patent Appln. No. 10420170640, dated Feb. 6, 2015, 14 pgs.
(Continued)

*Primary Examiner* — Vip Patel
(74) *Attorney, Agent, or Firm* — Volpe and Koenig, P.C.

(57) ABSTRACT

In order to achieve the increased efficiency of an organic light-emitting element, there is a need to reduce the influence of non-radiative recombination of electron-hole pairs except for surface plasmon polariton excitation, to convert most of exciton energy into visible light, and to tremendously improve the luminous efficiency of the organic light-emitting element. An organic light-emitting element according to the present invention includes a reflective electrode, a transparent electrode, and a light-emitting layer placed between the reflective electrode and the transparent electrode, and the organic light-emitting element is configured so that the light-emitting layer contains a host and a first dopant, and for the first dopant, one of the vertical component and horizontal component of the average value for transition dipole moments with respect to a substrate surface is larger than the other of the components.

30 Claims, 4 Drawing Sheets

(51) Int. Cl.
*H01L 51/56* (2006.01)
*H01L 51/00* (2006.01)

(56) References Cited

U.S. PATENT DOCUMENTS

| | | |
|---|---|---|
| 2005/0001543 A1 | 1/2005 | Nomura et al. |
| 2012/0007067 A1 | 1/2012 | Kaneta et al. |

FOREIGN PATENT DOCUMENTS

| | | |
|---|---|---|
| JP | 2001-155866 A | 6/2001 |
| JP | 2004-342336 A | 12/2004 |
| JP | 2007-035430 A | 2/2007 |
| JP | 2007-234254 A | 9/2007 |
| JP | 2008-210717 A | 9/2008 |
| WO | 2011/043083 A1 | 4/2011 |
| WO | 2011/132773 A1 | 10/2011 |

OTHER PUBLICATIONS

European Search Report, for EP Patent Appln. No. 12814721.2, dated Mar. 31, 2015, 8 pgs.

"Enhancement of electroluminescense through a two-dimensional corrugated metal film by grating-induced surface-plasmon cross coupling" by Jing Feng and Takayuki Okamoto, Optics Letters, vol. 30, No. 17, Sep. 1, 2005.

Japanese Office Action with English translation, Japanese Patent Appln. No. 2011-157417, Jul. 1, 2014, 4 pp.

ORGANIC LIGHT-EMITTING ELEMENT, LIGHT SOURCE DEVICE AND METHOD OF MANUFACTURING ORGANIC LIGHT-EMITTING ELEMENT

TECHNICAL FIELD

The present invention relates to an organic light-emitting element, a light source device, and a method of manufacturing an organic light-emitting element

BACKGROUND ART

As a conventional example, PTL 1 discloses the following technique. That is, an object of the technique is to provide an organic electroluminescence element improved in luminous efficiency "in such a way that organic molecules constituting a light-emitting layer are orientated parallel to the light-emitting surface", and an organic electroluminescence element obtained by sandwiching a light-emitting layer composed of an organic compound between an anode electrode layer and a cathode electrode layer is provided in which the light-emitting layer is formed by a dry process in vacuum, and the organic compound molecules constituting the light-emitting layer are orientated parallel to the planar direction of the light-emitting layer.

In addition, PTL 2 discloses the following technique. Specifically, an object of the technique is to reduce or eliminate the generation of various defective modes in order to improve the reliability (longer lifetime), which is an issue for organic light-emitting elements, and an organic thin-film EL device is provided which is characterized in that "organic molecules constituting a light-emitting layer are orientated vertical to the light-emitting surface", in other words, organic compound molecules are orientated in accordance with a direction in which current flows.

In addition, NPTL 1 discloses the following technique. Specifically, an object of the technique is to improve an organic light-emitting element in luminous efficiency, and an organic thin-film EL device is provided which is characterized in that the energy of surface plasmon polariton is converted into visible light by forming a two-dimensional nanostructure on a metal electrode adjacent to "a light-emitting layer subjected to no particular orientational control".

In addition, PTL 3 discloses the following technique. Specifically, an object of the technique is to extract light from a light-emitting layer to the outside with high efficiency, and an organic thin-film EL device is provided which is characterized in that a light-emitting element configured so that an organic material layer including at least one light-emitting layer composed of an organic EL material is placed between a first electrode layer and a second electrode layer to extract light emitted from the organic material layer to the electrode layer side with at least any one of the first electrode layer and the second electrode layer, further includes a metal microparticle layer of metal microparticles dispersed in a dielectric, and the light propagates through the metal microparticle layer to cause the metal microparticles in the metal microparticle layer to excite plasmon resonance.

CITATION LIST

Patent Literature

PLT 1: JP 11-102783 A
PLT 2: JP 2004-342336 A
PLT 3: JP 2007-35430 A

Non-Patent Literature

NPTL 1: OPTICS LETTERS Vol. 30, No. 17, p. 2302 (2005)

SUMMARY OF INVENTION

Technical Problem

However, the configuration and orientational control method described in PTL 1 have problems such as the complexity in manufacturing process and slow deposition rate. In addition, even with more horizontally orientated organic molecules, the non-radiative recombination of electron-hole pairs except for excitation of surface plasmon polariton is not able to be reduced, there is thus a limit on the improvement in internal quantum efficiency, and there is also a limit on the eventual improvement in luminous efficiency.

In addition, in the configuration described in PTL 2, the organic molecules constituting the light-emitting layer are orientated vertical to the light-emitting surface, so that the overlap between wave functions for charged particles is thus increased in a direction vertical to the light-emitting surface. Thus, it is possible to make current easy to flow. However, most of excited organic molecule energy in the vertically orientated organic molecules is consumed for the excitation of surface plasmon polariton. Accordingly, it is extremely difficult to improve the eventual luminous efficiency with the use of the organic molecules orientated vertical to the light-emitting surface.

In addition, while the configuration described in NPTL 1 can convert some of the energy consumed for the excitation of surface plasmon polariton into visible light, the energy of horizontally orientated organic molecules is not transferred to surface plasmon polariton, thus hardly able to be extracted, because organic molecules in the light-emitting layer are subjected to no particular orientational control. Furthermore, the energy of the horizontally orientated organic molecules is partly consumed for the non-radiative recombination of electron-hole pairs except for excitation of surface plasmon polariton. Therefore, the effect of improvement in luminous efficiency is limited.

Furthermore, the configuration in PTL 3 has a high-resistance dielectric layer sandwiched between the electrodes, and has difficulty with efficient current injection and there is thus a limit on improvement in luminous efficiency.

Based on the foregoing, an object of the present invention is to reduce the influence of non-radiative recombination of electron-hole pairs except for excitation of surface plasmon polariton, thereby improving the internal quantum efficiency, that is, converting most of exciton energy into visible light, and tremendously improving the luminous efficiency of an organic light-emitting element.

In addition, conventional orientational control methods have problems such as complexity in manufacturing processes and slow deposition rates, and the present invention thus provides a method of manufacturing an organic light-emitting element, which includes an effective orientational control method.

Solution to Problem

In order to solve the problems, one aspect of the present invention discussed from various perspectives is as follows.

An organic light-emitting element according to the present invention includes: a lower electrode and an upper electrode, one of which serves as a reflective electrode, and the other of which serves as a transparent electrode; and a light-emitting layer placed between the lower electrode and the upper electrode, the light-emitting layer containing a host and a first dopant, the first dopant contains a first functional group, for the first dopant, one of the vertical component and horizontal component of the average value for transition dipole moments with respect to a substrate surface is larger than the other of the components, and the concentration of the first dopant is higher in either one of: a region of the light-emitting layer with the upper electrode closer thereto; and a region thereof with the lower electrode closer thereto, than in the other of the regions.

In addition, in order to solve the problems, another aspect of the present invention discussed from various perspectives is as follows.

An organic light-emitting element according to the present invention includes: a reflective electrode; a transparent electrode; and a light-emitting layer placed between the reflective electrode and the transparent electrode, the light-emitting layer contains a host and a first dopant, for the first dopant, the vertical component of the average value for transition dipole moments with respect to the substrate surface is larger than the horizontal component thereof, and the reflective electrode has a concave-convex structure on a side closer to the light-emitting layer.

Furthermore, in order to solve the problems, another aspect of the present invention discussed from various perspectives is as follows.

An organic light-emitting element according to the present invention includes: an upper electrode; a lower electrode; and a light-emitting layer placed between the upper electrode and the lower electrode, the light-emitting layer contains a host and a first dopant, the first dopant contains a first functional group, the concentration of the first dopant is higher in either one of: a region of the light-emitting layer with the upper electrode closer thereto; and a region thereof with the lower electrode closer thereto, than in the other of the regions, and for the first dopant, the horizontal component of the average value for transition dipole moments with respect to a substrate surface is larger than a vertical component thereof.

Advantageous Effects of Invention

An advantageous effect of the present invention is that the influence of non-radiative recombination of electron-hole pairs can be reduced except for excitation of surface plasmon polariton to convert most of exciton energy into visible light, and tremendously improve the luminous efficiency of an organic light-emitting element.

Another advantageous effect of the present invention is that an organic light-emitting element, a light source device, and a method of manufacturing the organic light-emitting element can be provided in which the orientations of dopant molecules are controlled by a simple method to achieve high-efficiency light emissions.

DESCRIPTION OF EMBODIMENTS

Figure 1:
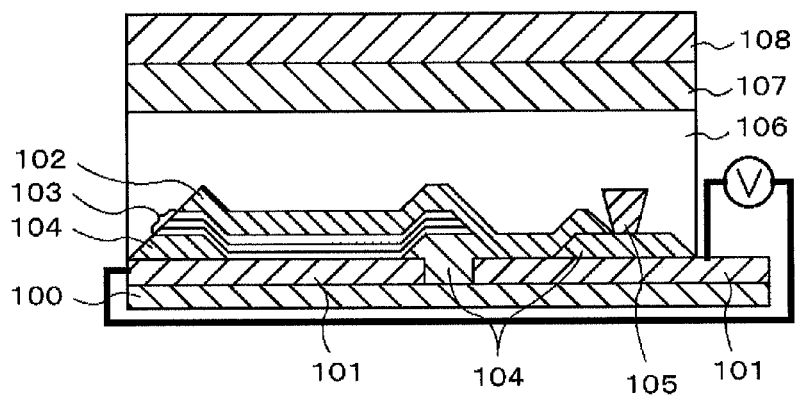
FIG. 1 is a cross-sectional view in an embodiment of a light source section in a light source device according to the present invention.

An embodiment of the present invention will be described below.

Description of Embodiment of the Invention I

<Luminous Efficiency of Organic Light-Emitting Device Decreased by Plasmon Absorption>

Organic light-emitting devices are promising techniques as displays, light sources, and devices for lighting. In the organic light-emitting devices, electric energy provided from an external power supply forms excitons (electron-hole pairs) on organic molecules of light-emitting layers in the organic light-emitting devices, the excess energy is turned into visible light when the excitons are relaxed (the electron-hole pairs are combined), and this visible light is emitted from the devices to the air. However, the energy of the organic molecules is not efficiently converted into light in the organic light-emitting devices, and the efficiency of light extraction to the outside is thus decreased. Here is the mechanism that interferes with this conversion from the excited organic molecules to visible light.

In general organic light-emitting devices, there is often a light-emitting layer within 250 nm from a metal electrode. In this case, there are excitons, that is, electric dipoles near the surface of the metal electrode. In this condition, evanescent waves included in the radiation field for the electric dipoles and the reflection field at the metal surface undergo near-field interaction with each other. Through this near-field interaction, the energy of the electric dipoles flows as tunnel energy into the metal, and is consumed for excitation energy of metal surface plasmon polariton. The excitation energy of the surface plasmon polariton dissipates as Joule heat for the finite lifespan of the surface plasmon polariton. The mechanism described above interferes with the conversion from the excited organic molecules to visible light (decreases the internal quantum efficiency).

For example, when the distance is adjusted to 75 nm between the metal electrode and the light-emitting position in the light-emitting layer, the energy consumed for the excitation of the surface plasmon polariton is approximately 25% of the exciton energy.

<Directional Control of Transition Dipole Moment>

In the discussion made above, the direction of the transition dipole moment in the organic molecules in the light-emitting layer is assumed to be random (isotropic). However, the energy consumed for the excitation of the surface plasmon polariton is less when the direction of the transition dipole moment is horizontal to the substrate, as compared with when the direction is vertical to substrate. For example, when the distance is adjusted to 75 nm between the metal electrode and the light-emitting position in the light-emitting layer, the energy consumed for the excitation of the surface plasmon polariton accounts for even 80% of the exciton energy in the case of the vertical direction of the transition dipole moment in the organic molecules, or 5% or less in the case of the horizontal direction of the transition dipole moment in the organic molecules.

The direction herein of the transition dipole moment in the organic molecules can be controlled with the molecular skeleton. For example, when all of the atoms constituting the molecules lie in the same plane (coplanar), the transition dipole moment is also directed in the molecular plane. In addition, the direction of the transition dipole moment can be also controlled by arranging, in the same plane, some of distributed atoms of electron-hole pairs involved in the transition in the molecules. In this case, there is no need for all of the atoms constituting the molecules to lie in the same plane. The direction of the average transition dipole moment in the light-emitting layer can be controlled (made vertical (horizontal)) by controlling the direction of the transition dipole moment in the molecules and controlling the orientations of the organic molecules (making the orientations vertical (horizontal)) in this way.

It is to be noted that in the discussion made above, for simplification, only the radiative recombination of electron-hole pairs and the excitation of surface plasmon polariton are considered as conversion pathways of the exciton energy, while non-radiative recombination of electron-hole pairs is not considered except for the excitation of surface plasmon polariton.

In addition, the transition dipole moment refers to a transition moment as an off-diagonal element among transition dipole matrix elements constituting electric dipole transition in molecules, and the absolute value of the moment is proportional to the oscillator strength, whereas the direction of the moment defines the radiation direction and polarization direction of light. More specifically, the electric dipole refers to a pair of charges with opposite signs (an electron-hole pair in this case), which is located at a distance, the transition dipole matrix elements, which are amounts appearing in the calculation of the transition probability between quantum states associated with dipole radiation, refer to matrix elements Pfi=<ψf|p|ψi> for the start state ψi and end state ψf of a dipole moment p as an operator, and above all, the transition between electronic states that differ between the start state and end state (that is, ψi not equal to ψf) is referred to as a transition moment. In particular, the transition dipole moment in the present invention means an average transition dipole moment of transitions involved in light emissions of the organic light-emitting devices.

The invention including a first feature of the present invention will be described below in detail with reference to the drawings, etc.

The following description is intended to demonstrate specific examples according to the inventive subject matter of the present application, the invention of the present application is not to be considered limited to these descriptions, and various changes and modifications can be made by those skilled in the art within the scope of the technical idea disclosed in this description.

In addition, throughout all of the drawings for illustrating the present invention, parts which have the same functions are denoted by the same symbols, and the repeated descriptions thereof may be omitted in some cases.

As a result of carrying out a great deal of studies in order to tremendously improve the luminous efficiency of the organic light-emitting element, the following finding has been provided. Specifically, due to the vertical orientation of organic molecules in a light-emitting layer, most energy is consumed for excitation of surface plasmon polariton. This consumption alone decreases the internal quantum efficiency, thus failing to improve the efficiency of extracting light to the outside. Therefore, it is commonly conceivable to use such a process that achieves the horizontal orientation of organic molecules. However, in general, the probability (rate) of non-radiative recombination other than surface plasmon polariton excitation has a finite value in horizontally oriented organic molecules, and there are thus limitations to improvements in internal quantum efficiency and luminous efficiency.

When a concave-convex nanostructure is formed which converts surface plasmon polariton energy into visible light after dissipating energy for surface plasmon polariton excitation, before non-radiative recombination other than surface plasmon polariton excitation is produced by the deliberate vertical orientation of the organic molecules in the light-emitting layer, it has been found that the luminous efficiency is significantly increased as compared with conventional methods. More specifically, an element configuration that, in the case of providing no concave-convex nanostructure that converts surface plasmon polariton energy into visible light, in return decreases the luminous efficiency (with vertically orientated organic molecules in a light-emitting layer) is formed. Then, a concave-convex nanostructure that converts surface plasmon polariton energy into visible light is provided. It has been found that an organic electroluminescence element is achieved which has a luminous efficiency further tremendously improved beyond the limit in the case of providing a conventional element structure (with isotropically (randomly) orientated organic molecules in a light-emitting layer) with a concave-convex nanostructure that converts surface plasmon polariton energy into visible light. This is because the energy of horizontally orientated organic molecules is partly lost for non-radiative recombination other than surface plasmon polariton excitation when the organic molecules are isotropically orientated, whereas the energy of excited organic molecules can be all converted into visible light in the configuration according to the present invention, without being consumed for non-radiative recombination other than surface plasmon polariton excitation.

This tremendous improvement in luminous efficiency is not able to be achieved in any way in the case of a conventional configuration with vertically orientated organic molecules in a light-emitting layer, as well as a configuration with a nanostructure formed on a metal electrode adjacent to a light-emitting layer subjected to no particular orientational control.

The details will be mentioned below.

FIG. 1 is a cross-sectional view in an embodiment of a light source section of a light source device according to the present invention.

FIG. 1 is a top-emission light source device for extracting light from the side with an upper electrode 102. In FIG. 1, a lower electrode 101, a first bank 104, a second bank 105, an organic layer 103, an upper electrode 102, a resin layer 106, a sealing substrate 107, and a light extraction layer 108 are placed in this order on a substrate 100. When a driving circuit and a housing, etc., are provided which are not shown in FIG. 1, the light source device is achieved. The organic light-emitting element refers to a section including the upper electrode 102, the lower electrode 101, and the organic layer 103.

It is to be noted that while the lower electrode 101 serves as an anode, the lower electrode 101 may serve as a cathode. The lower electrode 101 is formed by patterning through photolithography.

When the lower electrode 101 serves as an anode, the upper electrode 102 serves as a cathode. When the lower electrode 101 serves as a cathode, the upper electrode 102 serves as an anode. When the upper electrode 102 is an ITO or an IZO, a buffer layer may be provided between the organic layer 103 and the upper electrode 102 in some cases in the formation of an ITO or an IZO by a sputtering layer, in order to reduce the damage caused by the sputtering. A metal oxide such as a molybdenum oxide and a vanadium oxide is used for the buffer layer. The upper electrode 102 is connected to the lower electrode 101 in an adjacent light-emitting section. This connection can provide a plurality of light-emitting sections connected in series.

The first bank 104 formed on side surfaces of the organic light-emitting element has a forward tapered shape, and covers ends of the patterned lower electrode 101 to prevent partial short-circuit failure in the light-emitting section. The first bank 104 is formed by applying a bank forming material, and then carrying out development and exposure with the use of a predetermined photomask. The surface of the first bank 104 with the organic layer 103 present thereon may be subjected to a water-repellent treatment. The water-repellent treatment is carried out in such a way that, for example, the surface of the first bank 104 is subjected to a plasma treatment with a fluorine-based gas to fluorinate the surface of the first bank 104. This treatment forms a water-repellent layer on the surface of the first bank 104. A photosensitive polyimide is preferred as the first bank 104. In addition, acrylic resins, novolac resins, phenolic resins, non-photosensitive materials, etc. can be also used as the first bank 104.

The second bank 105 is formed on the first bank 104. The second bank 105 in an inverse tapered shape is used for keeping the upper electrode 102 in an adjacent light-emitting section from conduction. The second bank 105 is formed by applying a bank forming material, and then carrying out development and exposure with the use of a predetermined photomask. The surface of the second bank 105 with the organic layer 103 present thereon may be subjected to a water-repellent treatment. The water-repellent treatment is carried out in such a way that, for example, the surface of the second bank 105 is subjected to a plasma treatment with a fluorine-based gas to fluorinate the surface of the second bank 105. This treatment forms a water-repellent layer on the surface of the second bank 105. It is preferable to use a negative photoresist as the second bank 105. In addition, acrylic resins, novolac resins, phenolic resins, non-photosensitive materials, etc. can be also used as the second bank 105.

The resin layer 106 is formed on the upper electrode 102 and the second bank 105. The resin layer 106 is used for sealing the light-emitting section, and preventing the ingress of gas or moisture, which becomes a factor for degradation of the light-emitting element. Various types of polymers such as epoxy resins can be used as the resin layer 106. In order to improve the sealing performance, an inorganic passivation film on the upper electrode 102 can be also used as the resin layer 106.

The sealing substrate 107 is formed on the resin layer 106. The sealing substrate 107 is a glass substrate. However, besides the glass substrate, plastic substrates can be also used which have an appropriate gas barrier film.

The light extraction layer 108 is formed on the sealing substrate 107. The light extraction layer 108 is used to efficiently extract light produced in the organic layer 103. As the light extraction layer 108, a structure such as a microlens, a film which has a scattering property and a diffuse reflective property is used, for example.

The organic light-emitting element used herein may have a single element or multiple divided elements. Methods for connecting the multiple elements include methods for the respective elements connected in series or in parallel, or a combination thereof. In addition, when the organic light-emitting element is divided into multiple elements, the following aspects are conceivable. The first dopant, second dopant, and third dopant will be described later.

(1) There is a plurality of single organic light-emitting elements containing the first dopant, second dopant, and third dopant.
(2) There are an organic light-emitting element containing the first dopant and the second dopant and an organic light-emitting element containing the third dopant.
(3) There are an organic light-emitting element containing the first dopant, and an organic light-emitting element containing the second dopant, and an organic light-emitting element containing the third dopant.

When the organic light-emitting element containing a red dopant and a green dopant is combined with the organic light-emitting element containing a blue dopant in accordance with the aspect (2) mentioned above, the influence of the energy transfer can be minimized to cause the organic light-emitting element containing the blue dopant to efficiently emit light. In the aspect (3) mentioned above, when the first dopant, the second dopant, and third dopant are regarded as the red dopant, the green dopant, and the blue dopant, light emissions from the multiple organic light-emitting elements are mixed with each other to emit white light.

Figure 2:
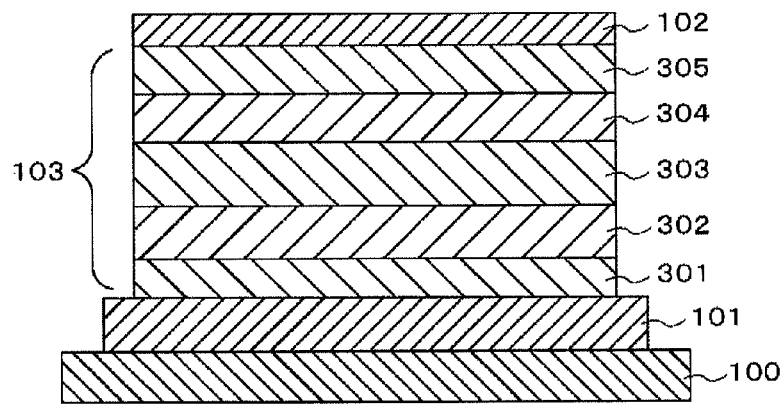
FIG. 2 is a cross-sectional view in an embodiment of an organic light-emitting element according to the present invention.

FIG. 2 is a cross-sectional view in an embodiment of an organic light-emitting element according to the present invention. An organic layer 103 may have a single-layer structure of only a light-emitting layer 303, or a multi-layer structure including any one or more of an electron injection layer 305, an electron transport layer 304, a hole transport layer 302, and a hole injection layer 301. The electron injection layer 305 and the electron transport layer 304, the electron transport layer 304 and the light-emitting layer 303, the light-emitting layer 303 and the hole transport layer 302, or the hole transport layer 302 and the hole injection layer 301 may be brought into contact with each other, and the other layers mentioned above may be interposed between the respective layers. In addition, the light-emitting layer 303 contains host molecules (hereinafter, referred to as a host) and dopant molecules (hereinafter, referred to as a dopant). When a light source section including the organic light-emitting element in FIG. 1 is provided with a driving circuit and a housing, etc., a light source device is achieved.

Figure 3:
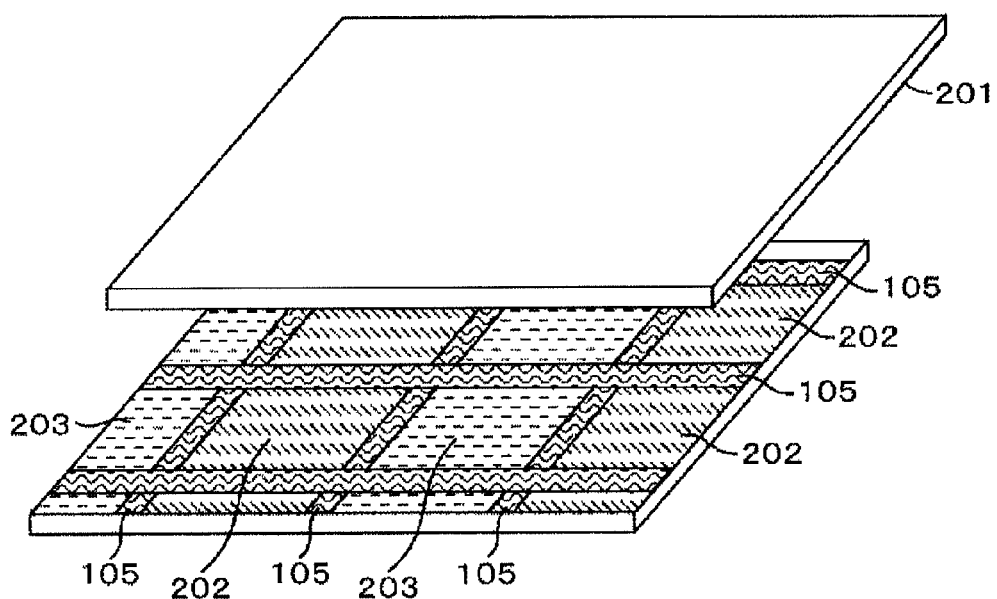
FIG. 3 is a perspective pattern diagram in an embodiment of a light source device according to the present invention.

FIG. 3 is a perspective pattern diagram in an embodiment of a light source device according to the present invention. A first organic light-emitting element 202 and a second organic light-emitting element 203 are divided by the second bank 105. A diffuser panel 201 is placed in a direction in which light is extracted from the first organic light-emitting element 202 and the second organic light-emitting element 203. In the case of using the configuration in accordance with the aspect (2), the first organic light-emitting element 202 in FIG. 3 serves as the organic light-emitting element containing the red dopant and the green dopant, whereas the second organic light-emitting element 203 therein serves as the organic light-emitting element containing the blue dopant. In the case of using the configuration in accordance with the aspect (3), the first organic light-emitting element 202 and second organic light-emitting element 203 in FIG. 3 serve as any of the organic light-emitting element containing the red dopant, the organic light-emitting element containing the green dopant, and the organic light-emitting element containing the blue dopant. The arrangement of the respective organic light-emitting elements may have a houndstooth shape, besides the striped shape as shown in FIG. 3. In the case of preparing the organic light-emitting elements by coating, the organic light-emitting elements in a striped arrangement can be more easily prepared as shown in FIG. 3.

When the elements for different colors are combined, the diffuser panel 201 may be attached above the light extraction surface of the organic light-emitting element in order to obtain favorable white light. A scatterer dispersed in resin or glass and a surface with a concave-convex structure formed thereon are conceivable as the diffuser panel 201.

<Luminescent Dopant>

The blue dopant has the maximum intensity of a PL spectrum at room temperature (25° C.) between 400 nm and 500 nm. The green dopant has the maximum intensity of a PL spectrum at room temperature between 500 nm and 590 nm. The red dopant has the maximum intensity of a PL spectrum at room temperature between 590 nm and 780 nm.

Fluorescent dopant and phosphorescent dopant skeletons with functional groups added thereto can be used as the luminescent dopants according to the present invention.

The fluorescent dopant skeletons include planar molecules of polycondensed aromatic compounds such as perylene, naphthalene, anthracene, pyrene, phenanthrene, pentacene, tetracene, chrysene, coumarin, coronene, perinone, and derivatives thereof.

The phosphorescent dopant skeletons include metalloporphyrin derivatives and four-coordinated metal complexes represented by the general formula (1) in (Chemical Formula 1).

[Chemical Formula 1]

General Formula (1)

(In the formula, N-L1-X1 and X2-L2-X3 each represent a bidentate ligand, and X1, X2, and X3 each independently represent a carbon atom, an oxygen atom, or a nitrogen atom. L1 and L2 represent groups of atoms that respectively form bidentate ligands along with N and X1 and X2 and X3. A central metal M represents Ni, Pd, Pt, Au, Ag, Rh, or Ir.) L1 in the general formula (1) is a polycondensed aromatic derivative such as benzoquinoline and phenanthroline, or a compound represented by the general formula (2) in (Chemical Formula 2).

[Chemical Formula 2]

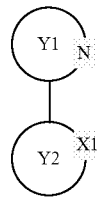

General Formula (2)

The aromatic hetero rings represented by Y1 include a quinoline ring, an isoquinoline ring, a pyridine ring, a quinoxaline ring, a thiazole ring, a pyrazole ring, a pyrimidine ring, a benzothiazole ring, an oxazole ring, a benzoxazole ring, an indole ring, and an isoindole ring. The aromatic hydrocarbon rings or aromatic hetero rings represented by Y2 include, besides the aromatic hetero rings denoted by Y1, a benzene ring, a naphthalene ring, an anthracene ring, a thiophene ring, a benzothiophene ring, a furan ring, a benzo furan ring, a fluorene ring, and a benzopyran ring. Substituents other than the functional groups may be added to the aromatic hetero rings or aromatic hydrocarbon rings. The substituents are, for example, alkyl groups (a methyl group, an ethyl group), substituted alkyl groups (a trifluoromethyl group), alkoxy groups (a methoxy group), halogen atoms (fluorine, chlorine), an amino group, a phenyl group, etc.

L2 in the general formula (1) may be any of the derivatives and compound included in L1, and other examples of L2 include an acetylacetonate derivative, a picolinate derivative, and a tetrakispyrazolylborate derivative.

The concentration of the blue dopant in the solid content is desirably 10 wt % or more and 30 wt % or less, the concentration of the green dopant in the solid content is desirably less than 10 wt %, and the concentration of the red dopant in the solid content is desirably less than 10 wt %. The luminescent dopants desirably have a weight average molecular weight of 500 or more and 3,000 or less.

<Functional Group>

The molecules of the luminescent dopants have molecules in various shapes such as a planar shape, a rod shape, a regular tetrahedral shape, a regular octahedral shape, and a spherical shape. These molecules can be oriented substantially vertical to the substrate surface by adding appropriate functional groups to the molecules. The orientation of the transition dipole moment is controlled by orientating the molecules.

The phrase "oriented substantially vertical" refers to the fact that the vertical component of the average value for the molecules with respect to the substrate surface is larger than the horizontal component. In this case, for example, when attention is drawn to planar molecules, the vertical component of the average value for the planar molecules with respect to the substrate surface is larger than the horizontal component. In addition, when attention is drawn to rod-like molecules, the vertical component of the average value for the long axes of the rod-like molecules with respect to the substrate surface is larger than the horizontal component. It is to be noted that the planar molecules refer to, for example, the polycondensed aromatic compounds mentioned above and the four-coordinated metal complexes represented by the general formula (1), and the rod-like molecules refer to molecules with the aspect ratio (short side/long side) between the short side length and the long side length in the range of 0.05 to 0.3.

The planar molecules or rod-like molecules as the luminescent dopants can be oriented substantially vertical to the substrate surface by adding appropriate functional groups to the molecules.

In the metal complex represented by the general formula (1), a functional group is added to either one or both of the bidentate ligands L1 and L2. The functional group preferably has low surface energy, or has a strong interaction with the base layer. In the case of using a functional group with low surface energy, examples of the functional group during the deposition include a fluoroalkyl group, a perfluoroalkyl group, an alkyl group (provided that the number of C is 10 or more), a perfluoropolyether group, and a siloxy group (—Si—O—Si—) which have low surface energy. In consideration of surface energy, a fluoroalkyl group and a perfluoropolyether group are desirable, and a perfluoroalkyl group is further desirable. Substituents including fluorine have stronger effects of moving to the film surface, as the number of fluorine atoms is increased. Specifically, the number of fluorine atoms present in the substituent is desirably 7 or more. These groups may be directly introduced into the main skeleton as in (Chemical Formula 3), and more preferably introduced with an amide linkage, an ester linkage, or the like interposed as in (Chemical Formula 4) in consideration of bond angle.

[Chemical Formula 3]

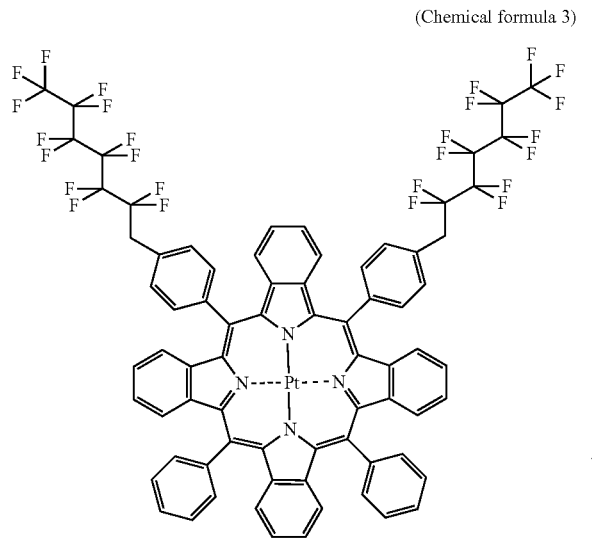

(Chemical formula 3)

[Chemical Formula 4]

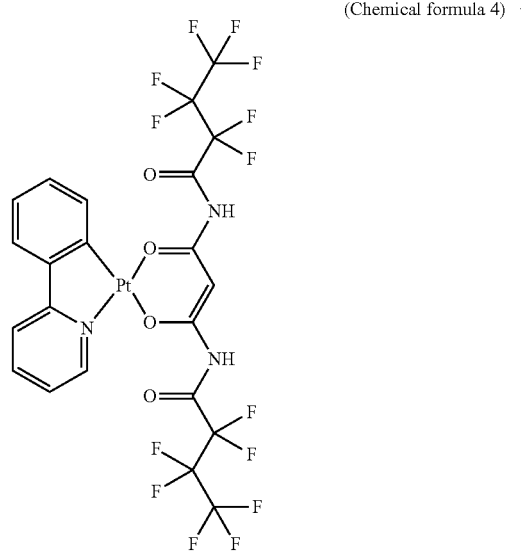

(Chemical formula 4)

In addition, examples of the functional group which has strong interaction with the base material include groups which have similar structures to the base layer (for example, a hole transport layer or an electron transport layer), such as a phenylamino group, an oxazole group, a carbazole group, and a hydrazone moiety, as well as a hydroxy group (—OH), a thiol group (—SH), a carboxyl group (—COOH), a sulfo group (—SO$_3$H), I, Br, Cl, F, SCN, CN, NH$_2$, NO$_2$, and a bipyridyl group. While these groups may be directly introduced into the main skeleton as in (Chemical Formula 5), the groups are preferably introduced with an alkyl chain or the like interposed, in consideration of molecular size and bond angle.

[Chemical Formula 5]

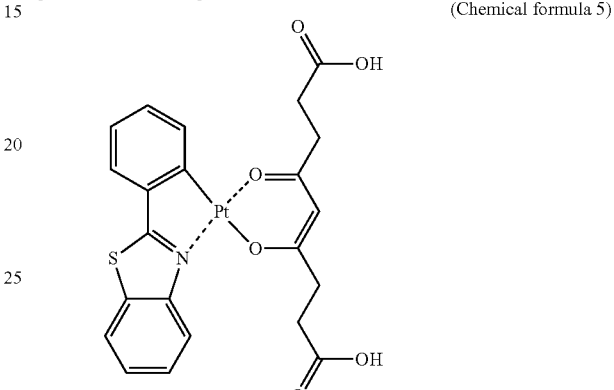

(Chemical formula 5)

There is a need to add one or more of the functional groups to the dopants. The functional group is added to either ends of the molecules in the case of rod-like molecules. In the case of planar molecules, for example, the functional group is added to only one ligand as in (Chemical Formula 6). For more vertical orientations, in the case of rod-like molecules, it is preferable to add the functional group with low surface energy to either ends of the molecules, and add the functional group which has a strong interaction with the base layer to the other ends thereof. In addition, in the case of planar molecules, as in (Chemical Formula 7), it is preferable to add the functional group with low surface energy to one ligand of the molecule, and add the functional group which has a strong interaction with the base layer to the other ligand thereof.

[Chemical Formula 6]

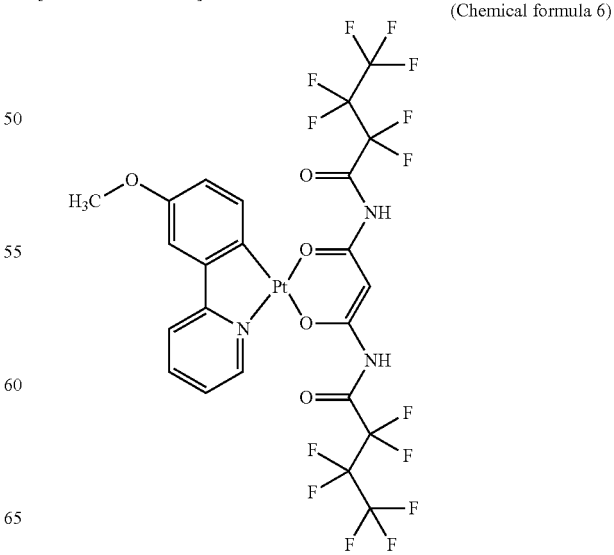

(Chemical formula 6)

-continued

[Chemical Formula 7]

(Chemical formula 7)

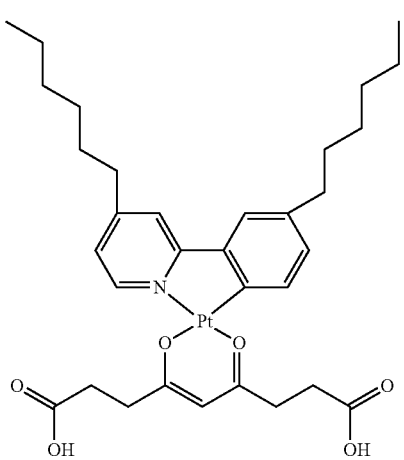

<Orientational Control Principle>

The surface of a substance is unstable with high energy without any gravitational effect, because there are generally no molecules of the same species on one side, unlike the inside (bulk) of the substance. Therefore, in order to reduce the surface energy, a deforming force (surface tension) is applied so as to reduce the surface area. In addition, when the substance has therein a molecule including a functional group with low surface energy, the surface energy is reduced for stabilization by exposing the functional group on the surface. For example, in the case of water and a surfactant (amphiphilic molecules), the surfactant has, in the molecules thereof, a hydrophobic group as a functional group with low surface energy, and reduces the surface energy of the water surface by forming a monomolecular film on the water surface in such a manner that the hydrophobic group comes out from the water surface.

The molecules in the present invention have therein a functional group with low surface energy, such as a fluoroalkyl group. The moiety such as a benzene ring is higher in surface energy than the functional group. When the film is formed, a force is applied so as to expose the functional group with low surface energy onto the surface, in order to reduce the surface energy. In the case of the molecules with the functional group added thereto as in (Chemical Formula 4), this action can move the functional group with low surface energy to the film surface to orientate the molecular surfaces substantially vertical to the substrate surface.

In addition, in the case of utilizing the interaction with the base layer, the functional group is attracted to the base layer by the action of an intermolecular force, a hydrogen bond, and a coordination bond between the base layer and the functional group. When the functional group is added as in (Chemical Formula 5), this action can orientate the molecular surfaces substantially vertical to the substrate surface.

In addition, as in (Chemical Formula 7), the addition of both the functional group with low surface energy and the group which has a strong interaction with the base layer can achieve more vertical orientations.

The oriented state can be examined by measuring an IR spectrum or a Raman spectrum while changing the incidence angle.

The oriented state of the organic molecules can be examined by measuring an IR spectrum or a Raman spectrum while changing the incidence angle.

In addition, the direction of the transition dipole moment can be evaluated by known methods. For example, (APPLIED PHYSICS LETTERS 96,073302(2010).), the radiation angle dependence of the P polarization component of photoluminescence can be experimentally measured after removing the interference effect of the thin-film device, with the use of hemispherical lens-cylindrical lens brought into optical contact with the organic light-emitting device, and compared with a computer simulation to figure out the proportions for each of the horizontal component and vertical component in the transition dipole moment. This is due to the fact that the angle dependence of the P polarization intensity is determined by the proportions of the horizontal component and vertical component (the S polarization is composed of only a horizontal component). The orientations of organic molecules constituting common light-emitting layers are random (isotropic), and therefore, the proportions of the components constituting the transition dipole moment are 50% for both the horizontal component and vertical component.

<Host>

It is preferable to use, as the host, a carbazole derivative, a fluorene derivative, an arylsilane derivative, or the like. In order to achieve efficient light emissions, the excitation energy of the host is preferably adequately higher than the excitation energy of the blue dopant. It is to be noted that the excitation energy is measured with the use of the emission spectrum.

<Hole Injection Layer>

The hole injection layer 301 is used for the purpose of improving the luminous efficiency or lifetime. In addition, although not particularly essential, the layer is used for the purpose of reducing the asperity of the anode. The hole injection layer 301 may be provided as a single layer or multiple layers. As the hole injection layer 301, conductive polymers are preferred such as PEDOT (poly(3,4-ethylenedioxythiophene)):PSS (polystyrene sulfonate) are preferred. Besides, polymer materials of polypyrrole and triphenylamine series can be used. In addition, it is also possible to apply phthalocyanine compounds and starburst amine compounds which are often used in combination with low molecular (weight average molecular weight: 10000 or less) materials.

<Hole Transport Layer>

The hole transport layer 302 is composed of a material that has the function of transport holes, and in a broad sense, the hole injection layer 301 and the electron blocking layer are also included in the electron transport layer. The hole transport layer 302 may be provided as a single layer or multiple layers. Starburst amine compounds, stilbene derivatives, hydrazone derivatives, thiophene derivatives, and the like can be used as the hole transport layer 302. In addition, the hole transport layer 302 is not to be considered limited to these materials, and there is no harm in using two or more of these materials in combination.

<Electron Transport Layer>

The electron transport layer 304 is a layer for supplying electrons to the light-emitting layer 303. In a broad sense, the electron injection layer 305 and the hole blocking layer are also included in the electron transport layer 304. The electron transport layer 304 may be provided as a single layer or multiple layers. For example, bis(2-methyl-8-quinolinolato)-4-(phenylphenolato)aluminum (hereinafter, BAlq), tris(8-quinolinolato)aluminum (hereinafter, Alq3), Tris(2,4,6-trimethyl-3-(pyridin-3-yl)phenyl)borane (hereinafter, 3TPYMB), 1,4-Bis(triphenylsilyl)benzene (hereinafter, UGH2), oxadiazole derivatives, triazole derivatives, fullerene derivatives, phenanthroline derivatives, quinoline derivatives, etc. can be used as a material for the electron transport layer 304.

<Electron Injection Layer>

The electron injection layer 305 improves the electron injection efficiency from the cathode into the electron transport layer 304. Specifically, lithium fluoride, magnesium fluoride, calcium fluoride, strontium fluoride, barium fluoride, magnesium oxide, and aluminum oxide are desirable. Obviously, the electron injection layer 305 is not to be limited to these materials, and there is no harm in using two or more of these materials in combination.

<Substrate>

Examples of the substrate 100 include glass substrates, metal substrates, and plastic substrates with inorganic materials such as $SiO_2$, SiNx, and $Al_2O_3$ formed. The metal substrate materials include alloys such as stainless steel and 42 alloy. The plastic substrate materials include polyethylene terephthalate, polyethylene naphthalate, polymethylmethacrylate, polysulfone, polycarbonate, and polyimide.

<Anode>

As the anode material, any material can be used as long as the material has transparency and a high work function. Specifically, the materials include conductive oxides such as an ITO and an IZO, and metals which are high in work function, such as thin Ag. The electrode pattern can be typically formed by using photolithography or the like on a substrate such as glass.

<Cathode Including Plasmon Extraction Nanostructure>

In addition, the cathode needs to have a concave-convex structure that is able to induce and scatter the surface plasmon polariton. The maximum height, width, and pitch of the concave and convex, which only have to be less than the emission wavelength, are thus desirably 5 nm or more and 800 nm or less. The emission wavelength in visible light thus ranges from 380 nm to 800 nm. In addition, when the concave and convex is less than 10 nm in size, problems will be caused such as difficulty in creation, an increase in cost, and the amplification of shorter wavelengths than in a visible region. Alternatively, the size more than 800 nm makes it difficult to scatter visible light. This film is referred to as a plasmon extraction nanostructure. Specifically, a granular film with a granular surface, or an island-shaped structure film of metal microparticles dispersed on a film in an aperiodic form or a periodic sequence pattern with voids present between the microparticles is preferred. The island-shaped structure film of the cathode converts the surface plasmon polariton induced by emitted light on the cathode, again into visible light to improve the internal quantum efficiency and luminous efficiency.

Al, Ag, Au, and Cu, as well as a laminated body of LiF and Al, an Mg:Ag alloy, etc. are preferably used as the cathode material. In addition, the cathode material is not to be considered limited to these materials, and for example, Cs compounds, Ba compounds, Ca compounds, etc. can be used in place of LiF. Furthermore, the plasmon extraction nanostructure desirably has a height from 40 nm to 120 nm, in order to produce strong surface plasmon polariton resonance with the near field created by the excited organic molecules. In terms of material, the cathode is more desirably made of a material that produces strong surface plasmon polariton resonance particularly with the near field created by the excited organic molecules, and it is possible to apply alloys containing, as their main constituent (80% or higher), any of Ag, Au, Cu, and Al. It is to be noted that Ag is desirable particularly when emitted light has a wavelength in the visible range. This is because, from the plasma frequency, Ag is able to produce surface plasmon resonance in the visible range. When emitted light has a wavelength other than the visible range, for example, infrared, Au is desirable.

It is to be noted that the organic light-emitting element as described above is configured to extract light from the anode side, for example, by sequential stacking from the cathode side on a substrate. The cathode can be formed by using, for example, a sputtering method, a vacuum deposition method, or the like. In addition, the plasmon extraction nanostructure can be created by applying known photolithography, embossing with the use of a roll, or the like to the cathode. Alternatively, the plasmon extraction nanostructure may be formed in such a manner that the concave and convex of the base are reflected in the upper layer by forming concave and convex comparable in size to the plasmon extraction nanostructure on a base substrate, and forming thereon the light-emitting layer, etc. Alternatively, the nanostructure may be formed by applying, onto a flat metal electrode, such metal nanoparticles that has sizes capable of plasmon extraction. Alternatively, metal nanoparticles may be immobilized on a metal electrode with the use of a SAM (self-assembled monolayer). Alternatively, a method in which a metal electrode thin film is deposited, and then heated at an atmospheric pressure or a reducing atmosphere, or a phenomenon in which an inhomogeneous island-shaped structure is spontaneously formed when the metal electrode thin film is deposited may be used. Alternatively, a structure of a metal thin film deposited in a calotte form on top of nanospheres may be prepared by applying and depositing nanospheres such as polystyrene on the order of 100 nm in diameter on a substrate, and depositing a metal thereon.

It is to be noted that it is often the case that the lifetime of the surface plasmon polariton excitation and visible light scattering are generally shorter than common radiative recombination rates and non-radiative recombination rates, and accordingly, luminescence through surface plasmon polariton can be confirmed by measuring the emission lifetime.

<Relationships Between Upper Electrode and Lower Electrode as Well as Transparent Electrode and Reflective Electrode>

Organic light-emitting elements include: a bottom-emission type of substrate/transparent electrode (anode)/organic layer/reflective electrode (cathode) for extracting light emissions from the organic layer from the substrate side (the side with the transparent electrode); and a top-emission type of substrate/reflective electrode (cathode)/organic layer/transparent electrode (anode) for extracting light emissions from the organic layer from the side (the side with the transparent electrode) opposite to the substrate. In the case of the bottom-emission type, the transparent electrode (anode) serves as the lower electrode, whereas the reflective electrode (cathode) serves as the upper electrode. In addition, in the case of the top-emission type, the reflective electrode (cathode) serves as the lower electrode, whereas the transparent electrode (anode) serves as the upper electrode. In the present invention, it is important to provide the upper electrode with the plasmon extraction nanostructure in the case of the bottom-emission type. In addition, it is important to provide the lower electrode with the plasmon extraction nanostructure in the case of the top-emission type. In any case of the types, it is important to provide the plasmon extraction nanostructure on the surface of the reflective electrode closer to the light-emitting layer.

<Coating Liquid>

The coating liquid is obtained by dissolving the material forming the light-emitting layer 303 in an appropriate solvent. In the following description, a case will be described in which a host, the red dopant, the green dopant, and the blue dopant can be included as the materials forming the light-emitting layer 303.

The solvent used herein may be, for example, aromatic hydrocarbon solvents such as toluene, ether solvents such as tetrahydrofuran, alcohols, fluorine solvents, etc., as long as the respective materials are dissolved in the solvent. In addition, mixed solvents may be adopted which have more than one of the previously mentioned solvents mixed for the adjustment of the solubility and drying rate for each material. The movement of the green dopant or blue dopant to the film surface can be promoted by, for example, preparing two types of solvents (first solvent and second solvent) that are different in boiling point, and adopting the second solvent with a higher boiling point as a solvent for the green or blue dopant. The solubility of the solvent is measured by a liquid chromatogram method.

Methods for depositing the light-emitting layer 303 can include vacuum deposition methods as drying methods, and spin coat methods, cast methods, dip coat methods, spray coat methods, screen printing methods, ink-jet printing methods, slot die coat methods, gravure coat methods, and bar-code methods as wet methods (application methods). One of these methods is used to form the light-emitting layer 303.

The application methods have advantages such as easy deposition for large areas and high material use efficiencies, as compared with the dry methods.

Next, specific examples of the present invention will be described. The present invention is not to be considered limited to the following examples as described previously.

Example 1

Figure 4:
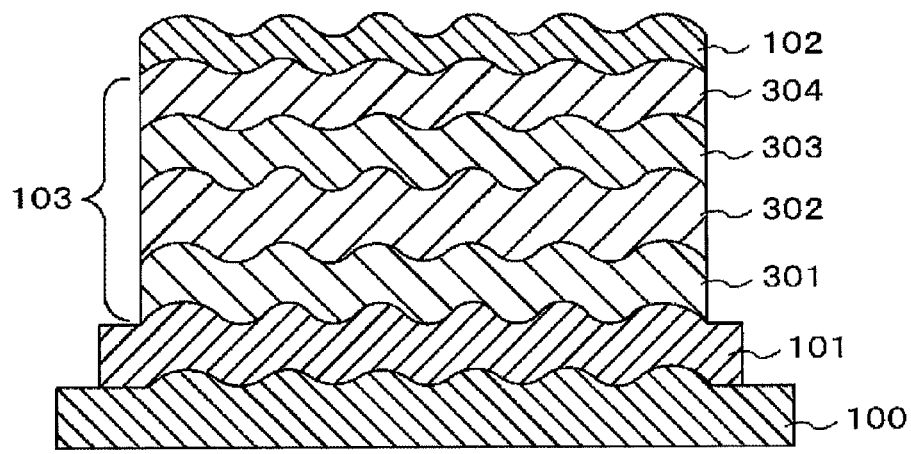
FIG. 4 is a white light-emitting element structured according to a first example of the present invention.

A white light-emitting element structured as shown in FIG. 4 was prepared as a first example of the present invention.

The substrate 100 was prepared as follows. A photoresist (from Tokyo Ohka Kogyo Co., Ltd.: THMR-iP3300) was applied onto a quartz substrate, doubly-exposed with a two-photon interference fringe from a He—Cd laser (wavelength: 325 nm) while turning 60°, and then developed, and the substrate was etched by reactive ion etching. Thereafter, the photoresist was removed to form concave and convex on the substrate. In this case, the concave-convex depth was 70 nm, and the concave-convex pitch was 420 nm. Through the formation of films on this substrate as follows, an organic light-emitting element can be formed with the concave and convex of the substrate kept, and a plasmon extraction nanostructure can be prepared where an Al film deposited finally also reflects the concave and convex of the base.

As the lower electrode (transparent electrode), an ITO electrode was formed by sputtering. For the hole injection layer 301, PEDOT was formed by a spin coating method. For the hole transport layer 302, a polymeric material was used. For the light-emitting layer 303, mCP (1,3-bis(carbazol-9-yl)benzene) was used as a host, and the (Chemical Formula 7), (Chemical Formula 3), and (Chemical Formula 6) were used respectively for the blue dopant, the red dopant, and the green dopant. The blue dopant has an emission wavelength of 460 nm. The respective materials were adjusted to 100:10:0.5:0.5 in terms of ratio by weight. The host and the blue, red, and green dopants were dissolved in toluene to prepare a coating liquid. The solid content concentration of the coating liquid was set to 1 wt %. This coating liquid was used to form an organic light-emitting layer by a spin coating method. Subsequently, as the electron transport layer 304, a layer of UGH2 and 3TPYMB was formed by a vacuum deposition method. Next, a laminated body of LiF and Al was formed as the upper electrode (reflective electrode). As described previously, the upper electrode (reflective electrode) keeps the concave and convex of the substrate, thus succeeding in the formation of a plasmon extraction nanostructure. In this way, an organic light-emitting element of a bottom-emission type was prepared. The light-emitting positions were adjusted near 75 nm from the upper electrode (reflective electrode) for each color dopant.

Figure 5:
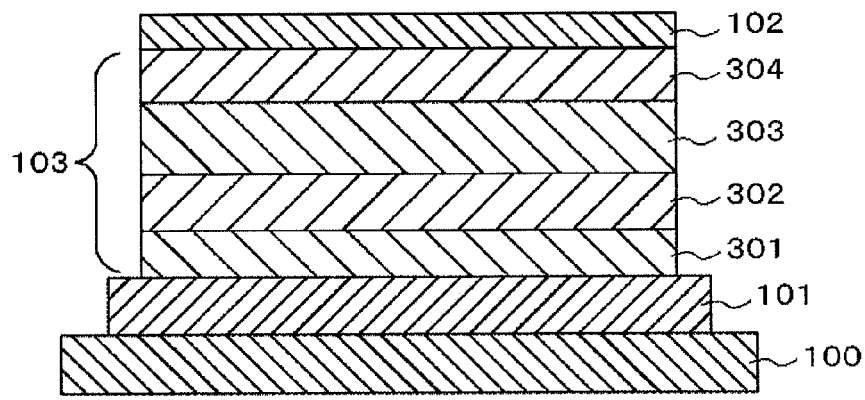
FIG. 5 is a cross-sectional view in the form of an organic light-emitting element according to a comparative example.

When a voltage was applied to the prepared organic light-emitting element, luminescence from the three dopants was confirmed from an EL spectrum to succeed in the confirmation of the white light emission. In addition, an element with the use of dopants with no functional groups added thereto was prepared as Comparative Example 1-1, and an element with no plasmon extraction nanostructure prepared on a quartz substrate as Comparative Example 1-2. The configuration of Comparative Example 1-2 is shown in FIG. 5. When the luminous efficiency of Comparative Example 1-1 was regarded 1, Example 1 exhibited 1.31 times higher, and the luminous efficiency of Comparative Example 1-2 was 0.15 times as high as Comparative Example 1-1.

Further, when a light-emitting layer configured as in Example 1 was separately manufactured by way of trial to measure the angle dependence of P polarization intensity in a photoluminescence measurement and figure out the proportions of components constituting the transition dipole moments for each color dopant, the vertical component was 95% for each of the colors. On the other hand, in Comparative Example 1-1, the horizontal component was 50% for each of the colors. In Comparative Example 1-2 using the dopants with the functional groups added thereto, the vertical component was thus 95% for each of the colors as in Example 1.

It is to be noted that as described in the previous section of this specification, when the transition dipole moment is directionally isotropic, approximately 75% of the exciton energy is converted into visible light, whereas 25% thereof results in a loss derived from surface plasmon polariton. Accordingly, the luminous efficiency in Example 1 with the directionally substantially vertical transition dipole moment and plasmon extraction nanostructure, which is 1.31 ($<(25+75)/75\approx1.33$) times as high as that in Comparative Example 1-1 with the directionally isotropic transition dipole moment, is believed to be because most of the loss due to surface plasmon polariton is converted by the plasmon extraction nanostructure into visible light. This has an adequately large value which is close to the upper limit as an improvement in efficiency. On the other hand, the luminous efficiency was substantially decreased in Comparative Example 2. This is believed to be because the functional groups made the transition dipole moments for each color dopant directionally substantially vertical, thus causing most exciton energy to result in a loss due to surface plasmon polariton.

In addition, the emission lifetime was measured in the following way. Each element was irradiated with nitrogen laser light (wavelength: 337 nm, pulse width: 1 ns) as excitation light, and the emission lifetime from each luminescent material was measured with a streak camera (C4334 from Hamamatsu Photonics K.K.). As a result, the emission lifetime in Example 1 was 24 ns, whereas the emission lifetime in Comparative Example 1-1 was 30 ns, and the emission lifetime in Comparative Example 1-2 was 624 ns. Accordingly, it is considered that luminescence through surface plasmon polariton is certainly observed in Example 1 and Comparative Example 1-2. In addition, in particular, in Example 1, the effect of improving the luminous efficiency with the plasmon extraction nanostructure is achieved more than in the case of Comparative Example 1-2.

Example 2

A light source device with a plurality of organic light-emitting elements connected was prepared as a second example of the present invention. For the prepared elements with the same substrate and layer configuration as in Example 1, elements (RG elements) containing, in their light-emitting layers, a host, the (Chemical Formula 3) as the red dopant, and the (Chemical Formula 5) as the green dopant, and elements (B elements) containing, in their light-emitting layers, a host and the (Chemical Formula 4) as the blue dopant were separately created in the plane, and connected in series and in parallel with each other. The blue dopant has an emission wavelength of 450 nm. For the preparation of the applied films, an ink-jet method was used. The light-emitting positions were adjusted near 75 nm from the upper electrode (reflective electrode) for each color dopant. In order to obtain homogeneous white light, a diffuser plate was attached to the light-emitting surfaces of the prepared elements. The prepared light source device achieved favorable white light. In addition, as Comparative Example 2, an element was prepared with the use of dopants having no functional groups added thereto. Example 2 exhibited 1.18 times as high luminous efficiency as compared with Comparative Example 2. Further, when a light-emitting layer configured as in Example 2 was separately manufactured by way of trial to measure the angle dependence of P polarization intensity in a photoluminescence measurement and figure out the proportions of components constituting the transition dipole moments for each color dopant, the vertical component was 84% or more for each of the colors. On the other hand, in Comparative Example 2, the vertical component was approximately 50% for each of the colors.

The luminous efficiency which is 1.18 times as high as in Example 1 is believed to be because a significant proportion of the loss due to surface plasmon polariton is converted into visible light by the plasmon extraction nanostructure, and has an adequately large value as an improvement in efficiency.

In addition, the attachment of the diffuser plate can extract, to the outside (air), more of visible light generated through the plasmon extraction nanostructure from exciton energy in the light-emitting layers. Accordingly, the efficiency improvement effect achieved by the directionally substantially vertical transition dipole moment and the plasmon extraction nanostructure can be further amplified to achieve a light source device with a higher luminous efficiency.

Example 3

A light source device with a plurality of organic light-emitting elements connected was prepared as a third example of the present invention. For the prepared elements with the same substrate and layer configuration as in Example 1, elements (R elements) containing, in their light-emitting layers, a host and the (Chemical Formula 3) as the red dopant, elements (G elements) containing, in their light-emitting layers, a host material and the (Chemical Formula 6) as the green dopant, and elements (B elements) containing, in their light-emitting layers, a host and the (Chemical Formula 4) as the blue dopant were separately created in the plane, and connected in series and in parallel with each other. The blue dopant has an emission wavelength of 455 nm. For the preparation of the applied films, an ink-jet method was used. The light-emitting positions were adjusted near 75 nm from the upper electrode (reflective electrode) for each color dopant. In order to obtain homogeneous white light, a diffuser plate was attached to the light-emitting surfaces of the prepared elements. The prepared light source device achieved favorable white light. In addition, as Comparative Example 3, an element was prepared with the use of dopants having no functional groups added thereto. Example 3 exhibited 1.23 times as high luminous efficiency as compared with Comparative Example 3. Further, when a light-emitting layer configured as in Example 3 was separately manufactured by way of trial to measure the angle dependence of P polarization intensity in a photoluminescence measurement and figure out the proportions of components constituting the transition dipole moments for each color dopant, the vertical component was 90% or more for each of the colors. On the other hand, in Comparative Example 3, the vertical component was approximately 50% for each of the colors.

The luminous efficiency which is 1.23 times as high as in Example 1 is believed to be because a significant proportion of the loss due to surface plasmon polariton is converted into visible light by the plasmon extraction nanostructure, and has an adequately large value as an improvement in efficiency.

In addition, the attachment of the diffuser plate can extract, to the outside (air), more of visible light generated through the plasmon extraction nanostructure from exciton energy in the light-emitting layers. Accordingly, the efficiency improvement effect achieved by the directionally substantially vertical transition dipole moment and the plasmon extraction nanostructure can be further amplified to achieve a light source device with a higher luminous efficiency.

Example 4

A white light-emitting element was prepared with the same substrate and layer configuration as in Example 1. However, as the dopants in the light-emitting layer, the (Chemical Formula 7), (Chemical Formula 3), and (Chemical Formula 6) were used respectively for the blue dopant, red dopant, and green dopant including the functional groups, while the dopants for each color with no functional groups added thereto (those used in Comparative Example 1) were correspondingly used. The proportion of the vertical component can be changed by mixing these dopants in appropriate proportions. For example, in the case of having 50% of (a) with the functional groups and 50% of (b) with no functional groups, the ratio between the vertical component and the horizontal component can be adjusted to (95+50):(5+50)=145:55=72.5:27.5, because the vertical component is 95% (the horizontal component is 5%) in the former ((a)), whereas the vertical component is 50% (the horizontal component is also 50%) in the isotropic latter ((b)). More specifically, the vertical component can be adjusted to 72.5% (the horizontal component can be adjusted to 27.5).

Figure 6:
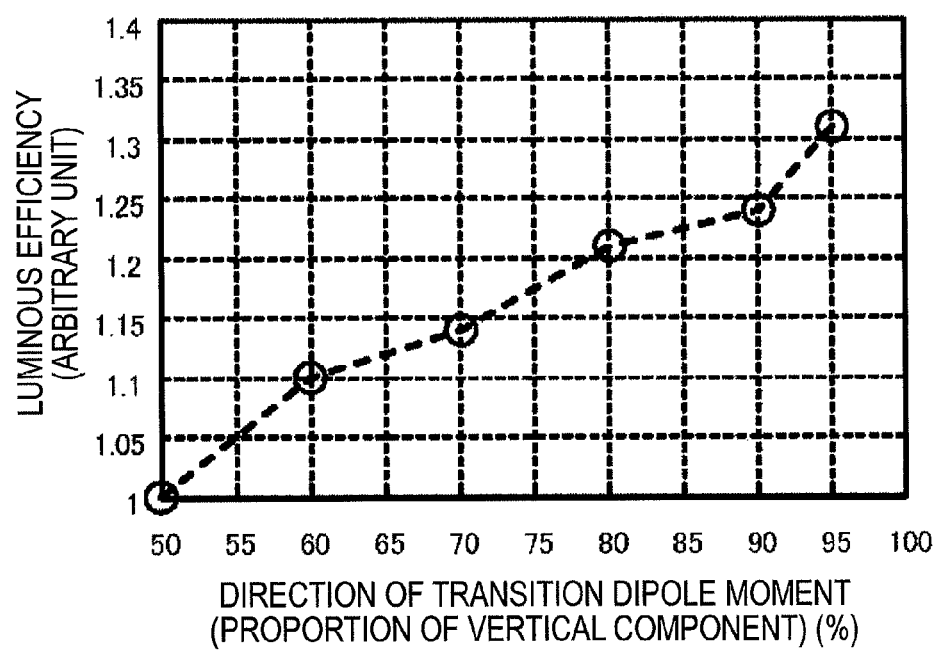
FIG. 6 is the result of examining the change in luminous efficiency depending on the proportion of the vertical component in an organic light-emitting element according to the present invention.

FIG. 6 shows the result of examining the change in luminous efficiency when the proportion of the vertical component was changed in the element (with the plasmon extraction nanostructure) according to Example 1. It is to be noted that the vertical component is 50% even when no functional group is used, the proportion of the vertical component less than 50% is thus not possible in the dopant mixing, and the result is thus shown in the case of the vertical component from 50% to 95%.

From FIG. 6, when the value of the luminous efficiency is regarded as 1 in the case of the vertical component of 50%, the luminous efficiency monotonically increases until the vertical component reaches 95% when the vertical component is more than 50% (preferably 60% or more). This is a reasonable result also from the fact that an electric dipole radiation field that produces the transition dipole moment of the vertical component strongly excites the surface plasmon polariton, so that this energy is efficiently extracted through the plasmon extraction nanostructure.

When the light-emitting position (the distance from the metal electrode, from 0 nm to 250 nm) or the wavelength (from 380 nm to 780 nm) is changed, the value of the luminous efficiency increases or decreases in the case of the vertical component of 50%, while the luminous efficiency monotonically increases until the vertical component reaches 95% in each case when the vertical component is more than 50% (preferably 60% or more). In the case of 100%, it is easily predicted from the principle described above that the luminous efficiency is further increased, and the vertical component more than 50% (preferably 60% or more) is thus preferred for the improvement in efficiency.

It is to be noted that in Examples 1 to 4, due to the dopant in the light-emitting layer 303, which includes one or more functional groups selected from, for example, a fluoroalkyl group, a perfluoroalkyl group, an alkyl group (the number of C is 10 or more), a perfluoropolyether group, and a siloxy group, the concentration of the dopant in the light-emitting layer 303 is higher in a region of the light-emitting layer 303 with the electron transport layer 304 and upper electrode 102 closer thereto than in a region of the light-emitting layer 303 with the electron transport layer 304 and upper electrode 102 farther therefrom. This is caused by the movement of the dopant to the region of the light-emitting layer 303 with the electron transport layer 304 and upper electrode 102 closer thereto.

In addition, in Examples 1 to 4, due to the dopant in the light-emitting layer 303, which includes one or more functional groups selected from, for example, —OH, —SH, —COOH, —SO$_3$H, I, Br, Cl, F, SCN, CN, NH$_2$, NO$_2$, and a bipyridyl group, a phenylamino group, an oxazole group, a carbazole group, and a hydrazone moiety, the concentration of the dopant in the light-emitting layer 303 is higher in a region of the light-emitting layer 303 with the hole transport layer 302 and lower electrode 101 closer thereto than in a region of the light-emitting layer 303 with the hole transport layer 302 and lower electrode 101 farther therefrom. This is caused by the movement of the dopant to the region of the light-emitting layer 303 with the hole transport layer 302 and lower electrode 101 closer thereto.

The region of the light-emitting layer 303 with the electron transport layer 304 and upper electrode 102 closer thereto refers herein to a region from the center to the end in a direction toward the electron transport layer 304 and upper electrode 102 each located. The region of the light-emitting layer 303 with the electron transport layer 304 and upper electrode 102 farther therefrom refers to a region from the center to the end in a direction opposite to the direction toward the electron transport layer 304 and upper electrode 102 each located.

In addition, the region of the light-emitting layer 303 with the hole transport layer 302 and lower electrode 101 closer thereto refers to a region from the center to the end in a direction toward the hole transport layer 302 and lower electrode 101 each located. In addition, the region of the light-emitting layer 303 with the hole transport layer 302 and lower electrode 101 farther therefrom refers to a region from the center to the end in a direction opposite to the direction toward the hole transport layer 302 and lower electrode 101 each located.

Example 5

Figure 7:
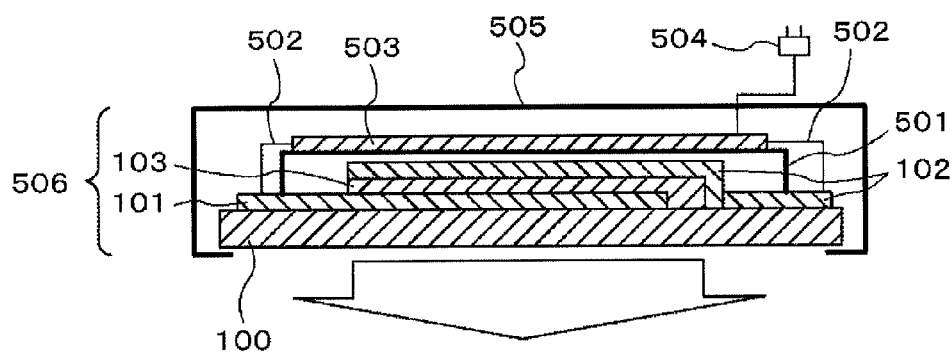
FIG. 7 is a configuration diagram of a light source device according to the present invention.

A light source device as shown in FIG. 7 was prepared as an example of the present invention. An organic light-emitting element as a component of the light source device is composed of a substrate 100, a lower electrode 101, an organic layer 103, and an upper electrode 102 as in the case of Example 1. The organic light-emitting element is sealed with a sealing tube glass 501 with a desiccant agent so as to cut off the organic layer 103 from the outside air. In addition, the lower electrode 101 and the upper electrode 102 are each connected through a wiring 502 to a driving circuit 503. Further, the organic light-emitting element with the sealing tube glass 501 and the driving circuit 503 are covered with a housing 505 to serve as the light source device 506 as a whole. It is to be noted that the device is lighted up by connecting the driving circuit 503 through a plug 504 to an external power supply. In the case of the preparation of a light source device A with the use of the organic light-emitting element according to Example 1 and a light source device B with the use of the organic light-emitting element according to Comparative Example 1, the light source device A succeeded in lowering the power consumption by 22% with respect to the light source device B.

Description of Embodiment of the Invention II

In the following description, the same descriptions of the following described in the previous section <<Description of Embodiment of the Invention II>> will be omitted, and different parts will be described in the section: <Hole Injection Layer>, <Hole Transport Layer>, <Electron Transport Layer>, <Electron Injection Layer>, <Substrate>, <Anode>, <Coating Liquid>, <Luminous Efficiency of Organic Light-Emitting Device Decreased by Plasmon Absorption>, <Hole Injection Layer>, <Hole Transport Layer>, <Electron Transport Layer>, <Electron Injection Layer>, <Substrate>, <Anode>, <Coating Liquid>

It is to be noted that even among the items as will be described in the same way as the previous description, the items as will be easy to understand by giving explanations again will be described once again.

<Reduction of Plasmon Absorption Loss by Control of Transition Dipole Moment>

As described previously, the energy consumed for the excitation of the surface plasmon polariton is less when the direction of the transition dipole moment is horizontal to the substrate, as compared with when the direction is vertical to substrate. For example, when the distance is adjusted to 75 nm between the metal electrode and the light-emitting position in the light-emitting layer, the energy consumed for the excitation of the surface plasmon polariton accounts for even 80% of the exciton energy in the case of the vertical direction of the transition dipole moment in the organic molecules, or 5% or less in the case of the horizontal direction of the transition dipole moment in the organic molecules.

The direction herein of the transition dipole moment in the organic molecules can be controlled with the molecular skeleton. For example, when all of the atoms constituting the molecules lie in the same plane (coplanar), the transition dipole moment is also directed in the molecular plane. In addition, the direction of the transition dipole moment can be also controlled by arranging, in the same plane, some of distributed atoms of electron-hole pairs involved in the transition in the molecules. In this case, there is no need for all of the atoms constituting the molecules to lie in the same plane. The direction of the average transition dipole moment in the light-emitting layer can be controlled (made vertical (horizontal)) by controlling the direction of the transition dipole moment in the molecules and controlling the orientations of the organic molecules (making the orientations vertical (horizontal)) in this way.

Based on the foregoing, it is possible to achieve the increased efficiency of the organic light-emitting device also by, for example, making the orientations of the organic molecules on the flat plate horizontal in order to make the average transition dipole moment in the light-emitting layer horizontal, and converting the energy consumed for the excitation of the surface plasmon polariton more into visible light.

The details will be mentioned below.

<Luminescent Dopant>

The blue dopant has the maximum intensity of a PL spectrum at room temperature (25° C.) between 400 nm and 500 nm. The green dopant has the maximum intensity of a PL spectrum at room temperature between 500 nm and 590 nm. The red dopant has the maximum intensity of a PL spectrum at room temperature between 590 nm and 780 nm.

Fluorescent dopant and phosphorescent dopant skeletons with functional groups added thereto can be used as the luminescent dopants according to the present invention.

The fluorescent dopant skeletons include planar molecules of polycondensed aromatic compounds such as perylene, naphthalene, anthracene, pyrene, phenanthrene, pentacene, tetracene, chrysene, coumarin, coronene, perinone, and derivatives thereof.

The phosphorescent dopant skeletons include metalloporphyrin derivatives and four-coordinated metal complexes represented by the general formula (1) in (Chemical Formula 1).

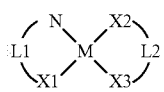

General Formula (1)

(In the formula, N-L1-X1 and X2-L2-X3 each represent a bidentate ligand, and X1, L2, and X3 each independently represent a carbon atom, an oxygen atom, or a nitrogen atom. L1 and L2 represent groups of atoms that respectively form bidentate ligands along with N and X1 and X2 and X3. A central metal M represents Ni, Pd, Pt, Au, Ag, Rh, or Ir.) L1 in the general formula (1) is a polycondensed aromatic derivative such as benzoquinoline and phenanthroline, or a compound represented by the general formula (2) in (Chemical Formula 2).

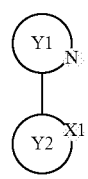

General Formula (2)

The aromatic hetero rings represented by Y1 include a quinoline ring, an isoquinoline ring, a pyridine ring, a quinoxaline ring, a thiazole ring, a pyrazole ring, a pyrimidine ring, a benzothiazole ring, an oxazole ring, a benzoxazole ring, an indole ring, and an isoindole ring. The aromatic hydrocarbon rings or aromatic hetero rings represented by Y2 include, besides the aromatic hetero rings denoted by Y1, a benzene ring, a naphthalene ring, anthracene ring, a thiophene ring, a benszothiophene ring, a furan ring, a benzo furan ring, a fluorene ring, and a benzopyran ring. Substituents other than the functional groups may be added to the aromatic hetero rings or aromatic hydrocarbon rings. The substituents are, for example, alkyl groups (a methyl group, an ethyl group), substituted alkyl groups (a trifluoromethyl group), alkoxy groups (a methoxy group), halogen atoms (fluorine, chlorine), an amino group, a phenyl group, etc.

L2 in the general formula (1) may be any of the derivatives and compound included in L1, and other examples of L2 include an acetylacetonate derivative, a picolinate derivative, and a tetrakispyrazolylborate derivative.

The concentration of the blue dopant in the solid content is desirably, 10 wt % or more and 30 wt % or less, the concentration of the green dopant in the solid content is desirably less than 10 wt %, and the concentration of the red dopant in the solid content is desirably less than 10 wt %. The luminescent dopants desirably have a weight average molecular weight of 500 or more and 3,000 or less.

<Functional Group>

The molecules of the luminescent dopants have molecules in various shapes such as a planar shape, a rod shape, a regular tetrahedral shape, a regular octahedral shape, and a spherical shape. These molecules can be oriented substantially horizontal to the substrate surface by adding appropriate functional groups to the molecules. The orientation of the transition dipole moment is controlled by orientating the molecules.

The phrase "oriented substantially horizontal" refers to the fact that the horizontal component of the average value for the molecules with respect to the substrate surface is larger than the vertical component. In this case, for example, when attention is drawn to planar molecules, the horizontal component of the average value for the planar molecules with respect to the substrate surface is larger than the vertical component. In addition, when attention is drawn to rod-like molecules, the horizontal component of the average value for the long axes of the rod-like molecules with respect to the substrate surface is larger than the vertical component. It is to be noted that the planar molecules refer to, for example, the polycondensed aromatic compounds mentioned above and the four-coordinated metal complexes represented by the general formula (1), and the rod-like molecules refer to molecules with the aspect ratio (short side/long side) between the short side length and the long side length in the range of 0.05 to 0.3.

The planar molecules or rod-like molecules as the luminescent dopants can be oriented substantially horizontal to the substrate surface by adding appropriate functional groups to the molecules.

In the metal complex represented by the general formula (1), a functional group is added to either one or both of the bidentate ligands L1 and L2. The functional group preferably has low surface energy, or has a strong interaction with the base layer. In the case of using a functional group with low surface energy, examples of the functional group during the deposition include a fluoroalkyl group, a perfluoroalkyl group, an alkyl group (provided that the number of C is 10 or more), a perfluoropolyether group, and a siloxy group (—Si—O—Si—) which have low surface energy. In consideration of surface energy, a fluoroalkyl group and a perfluoropolyether group are desirable, and a perfluoroalkyl group is further desirable. Substituents including fluorine have stronger effects of moving to the film surface, as the number of fluorine atoms is increased. Specifically, the number of fluorine atoms present in the substituent is desirably 7 or more. These groups may be directly introduced into the main skeleton as in (Chemical Formula 8), and more preferably introduced with an amide linkage, an ester linkage, or the like interposed as in (Chemical Formula 9) in consideration of bond angle.

[Chemical Formula 8]

(Chemical Formula 8)

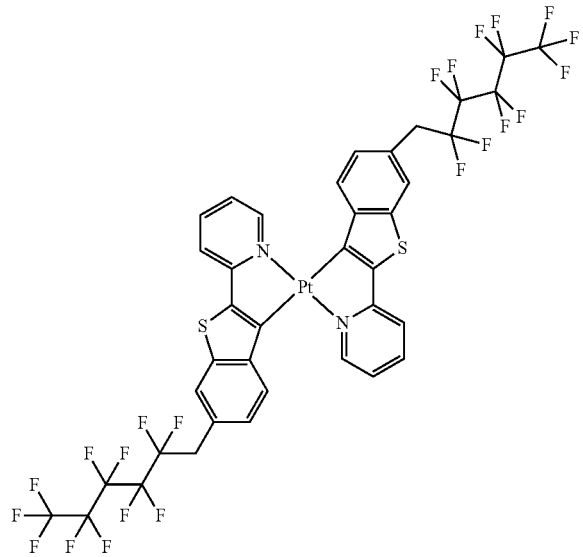

[Chemical Formula 9]

(Chemical Formula 9)

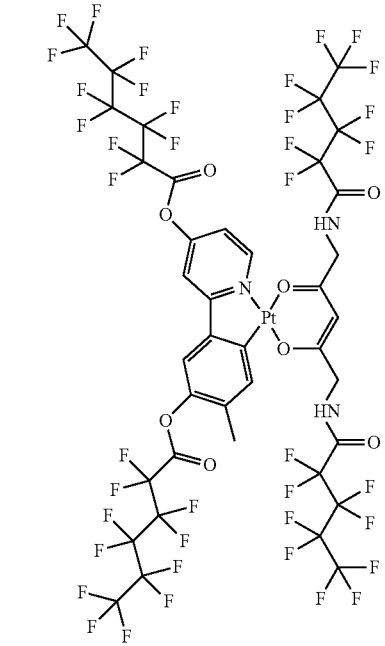

In addition, examples of the functional group which has strong interaction with the base material include groups which have similar structures to the base layer (for example, a hole transport layer or an electron transport layer), such as a phenylamino group, an oxazole group, a carbazole group, and a hydrazone moiety, as well as a hydroxy group (—OH), a thiol group (—SH), a carboxyl group (—COOH), a sulfo group (—SO$_3$H), I, Br, Cl, F, SCN, CN, NH$_2$, NO$_2$, and a bipyridyl group. While these groups may be directly introduced into the main skeleton, the groups are preferably introduced with an alkyl chain or the like interposed as in (Chemical Formula 10) in consideration of molecular size and bond angle.

[Chemical Formula 10]

(Chemical Formula 10)

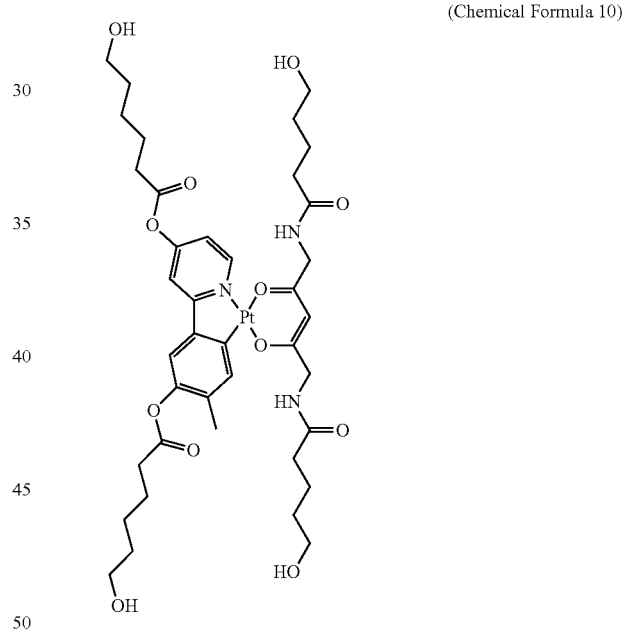

There is a need to add two or more of the functional groups to the dopants. It is preferable to add four functional groups in the case of planar molecules. The functional groups are added to both ends of the molecules in the case of rod-like molecules. In the case of planar molecules, the functional groups are added to both ends of lines passing through the gravity centers of the molecules, for example, as in (Chemical Formula 11). In the case of planar molecules, more horizontal orientations can be achieved by adding four functional groups as in (Chemical Formula 12).

[Chemical Formula 11]
(Chemical Formula 11)
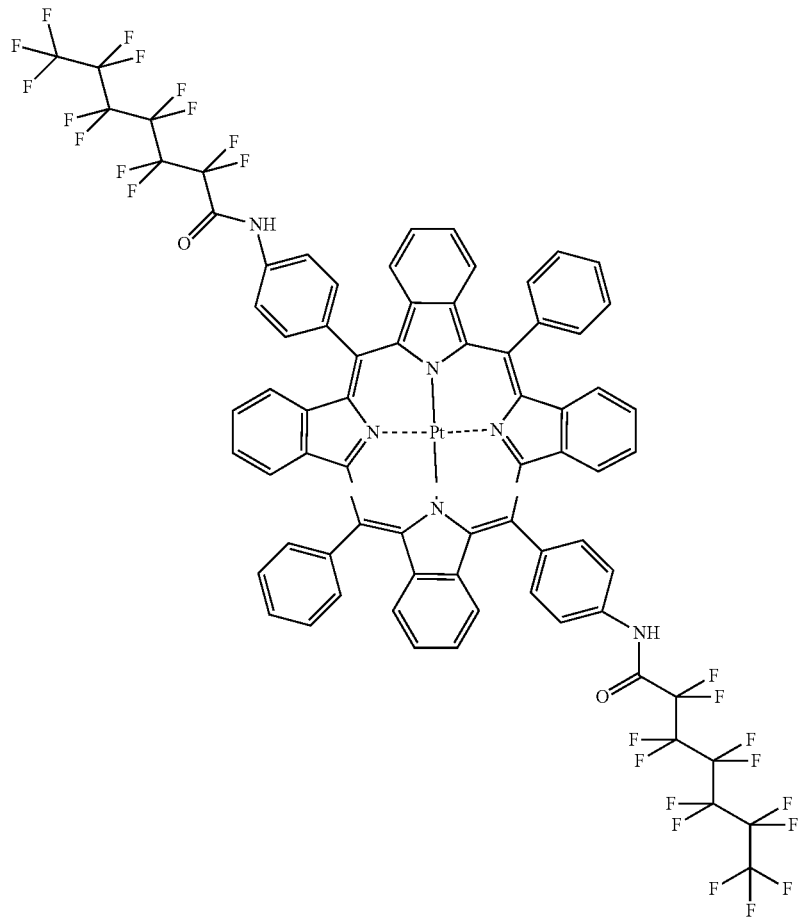
[Chemical Formula 12]
(Chemical Formula 12)
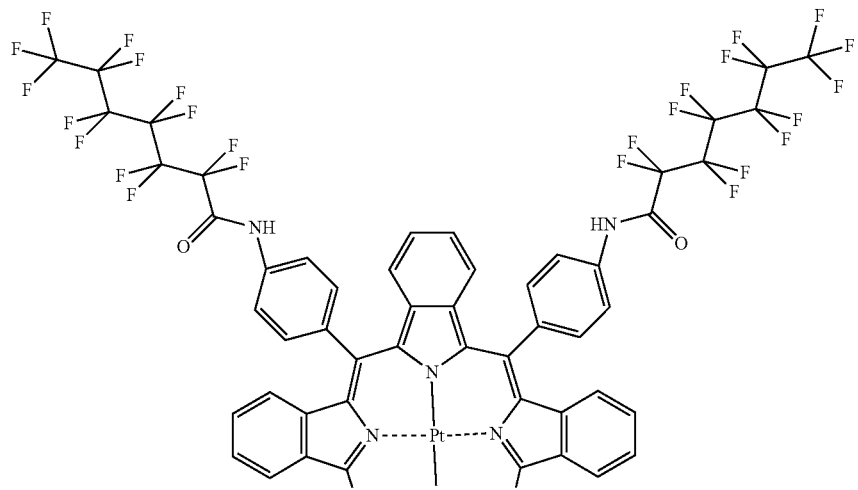

-continued

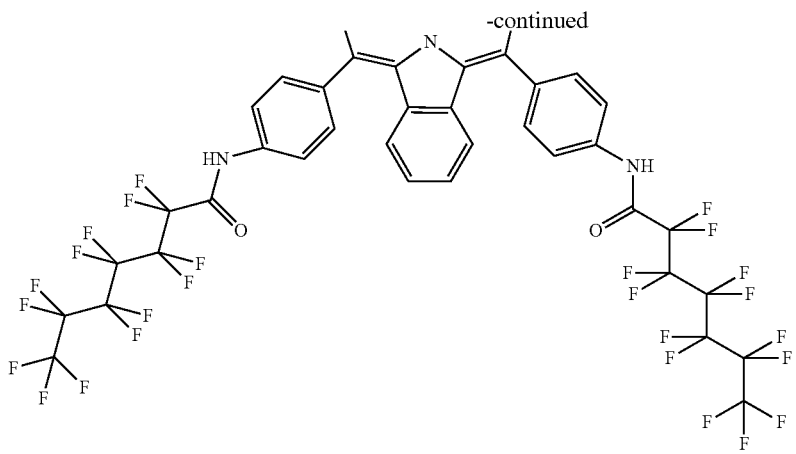

<Orientational Control Principle>

The surface of a substance is unstable with high energy without any gravitational effect, because there are generally no molecules of the same species on one side, unlike the inside (bulk) of the substance. Therefore, in order to reduce the surface energy, a deforming force (surface tension) is applied so as to reduce the surface area. In addition, when the substance has therein a molecule including a functional group with low surface energy, the surface energy is reduced for stabilization by exposing the functional group on the surface. For example, in the case of water and a surfactant (amphiphilic molecules), the surfactant has, in the molecules thereof, a hydrophobic group as a functional group with low surface energy, and reduces the surface energy of the water surface by forming a monomolecular film on the water surface in such a manner that the hydrophobic group comes out from the water surface.

The molecules in the present invention have therein a functional group with low surface energy, such as a fluoroalkyl group. The moiety such as a benzene ring is higher in surface energy than the functional group. When the film is formed, a force is applied so as to expose the functional group with low surface energy onto the surface, in order to reduce the surface energy. In the case of the molecules with the functional group added thereto as in (Chemical Formula 12), this action can move the functional group with low surface energy to the film surface to orientate the molecular surfaces substantially horizontal to the substrate surface.

In addition, in the case of utilizing the interaction with the base layer, the functional group is attracted to the base layer by the action of an intermolecular force, a hydrogen bond, and a coordination bond between the base layer and the functional group. When the functional group is added as in (Chemical Formula 5), this action can orientate the molecular surfaces substantially horizontal to the substrate surface.

The oriented state of the organic molecules can be examined by measuring an IR spectrum or a Raman spectrum while changing the incidence angle.

In addition, the direction of the transition dipole moment can be evaluated by known methods. For example, (APPLIED PHYSICS LETTERS 96,073302(2010).), the radiation angle dependence of the P polarization component of photoluminescence can be experimentally measured after removing the interference effect of the thin-film device, with the use of hemispherical lens-cylindrical lens brought into optical contact with the organic light-emitting device, and compared with a computer simulation to figure out the proportions for each of the horizontal component and vertical component in the transition dipole moment. This is due to the fact that the angle dependence of the P polarization intensity is determined by the proportions of the horizontal component and vertical component (the S polarization is composed of only a horizontal component). The orientations of organic molecules constituting common light-emitting layers are random (isotropic), and therefore, the proportions of the components constituting the transition dipole moment are 50% for both the horizontal component and vertical component.

Figure 8:
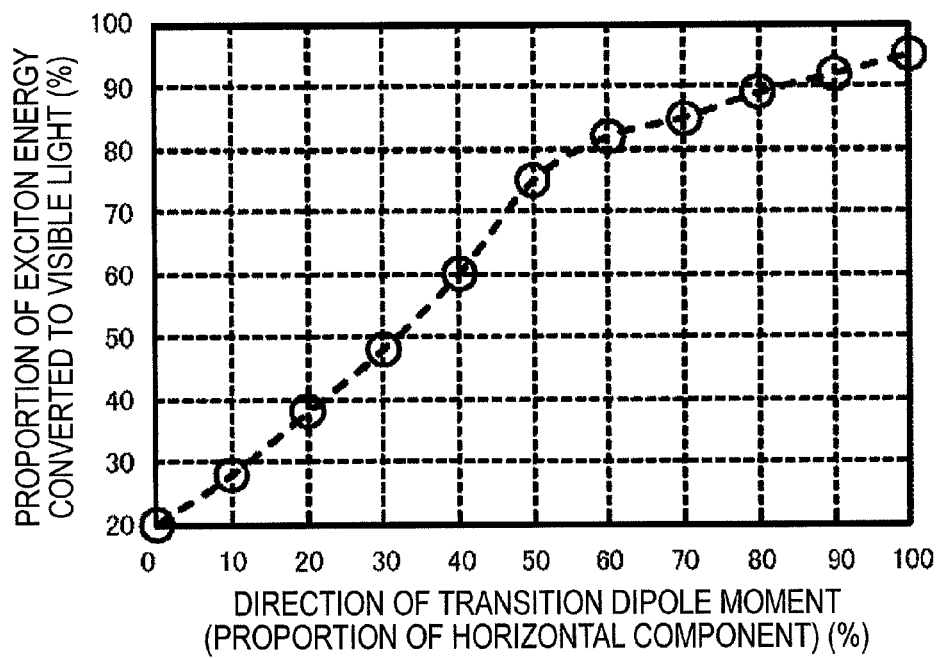
FIG. 8 shows the result of examining the change in luminous efficiency depending on the proportion of a horizontal component in an organic light-emitting element according to the present invention.

FIG. 8 shows the result of calculating the relationship between the direction of a transition dipole moment (the proportion of a horizontal component) (%) and the proportion of exciton energy converted into visible light (%). The calculation uses a self-produced organic device simulator, which takes account of the interference effect of optical thin films and the near-field interactions between electric dipoles such as surface plasmon and metal interfaces. The structure has an aluminum reflective electrode (upper electrode, film thickness: 150 nm), an organic light-emitting layer (film thickness: 250 nm), an ITO transparent electrode (lower electrode, film thickness: 150 nm), and a glass substrate (BK7, thickness: 0.7 mm). Actual measured values were used for the refractive indexes of the upper electrode, lower electrode, and glass substrate, for the refractive index of the organic light-emitting layer was adjusted to 1.8 in accordance with the refractive indexes of a typical light-emitting layer. In addition, the light-emitting position was set in a position of 75 nm from the upper electrode, and the emission wavelength was adjusted to 550 nm.

From FIG. 8, the value of the proportion of the exciton energy converted into visible light in the case of the horizontal component of 50% monotonically increases until the horizontal component reaches 100% when the horizontal component is more than 50% (preferably 60% or more). This is a reasonable result also from the fact that an electric dipole radiation field that produces the transition dipole moment of the horizontal component is almost unable to excite surface plasmon excitation.

When the light-emitting position (the distance from the metal electrode, from 0 nm to 250 nm) or the wavelength (from 380 nm to 780 nm) is changed, the value of the proportion of the exciton energy converted into visible light increases or decreases from 75% in the case of the horizontal component of 50%, while the proportion (%) of the exciton energy converted into visible light monotonically increases until the horizontal component reaches 100% in each case when the horizontal component is more than 50% (preferably 60% or more).

<Host>

It is preferable to use, as the host, a carbazole derivative, a fluorene derivative, an arylsilane derivative, or the like. In order to achieve efficient light emissions, the excitation energy of the host is preferably adequately higher than the excitation energy of the blue dopant. It is to be noted that the excitation energy is measured with the use of the emission spectrum.

<Cathode>

The cathode material serves as a reflective electrode for reflecting light from the light-emitting layer 303. Specifically, a laminated body of LiF and Al, an Mg:Ag alloy, etc. are preferably used. In addition, the cathode is not to be considered limited to these materials, and for example, Cs compounds, Ba compounds, Ca compounds, etc. can be used in place of LiF.

Next, specific examples of the present invention will be described. The present invention is not to be considered limited to the following examples as described previously.

Example 6

A white light-emitting element structured as shown in FIG. 3 was prepared as a sixth example of the present invention. An ITO electrode and PEDOT were formed by a spin coat method respectively for the lower electrode and the hole injection layer. A polymeric material was used for the hole transport layer. For the organic light-emitting layer, mCP (1,3-bis(carbazol-9-yl)benzene) was used as a host, and the (Chemical Formula 10), (Chemical Formula 12), and (Chemical Formula 13) were used respectively for the blue dopant, the red dopant, and the green dopant.

[Chemical Formula 13]

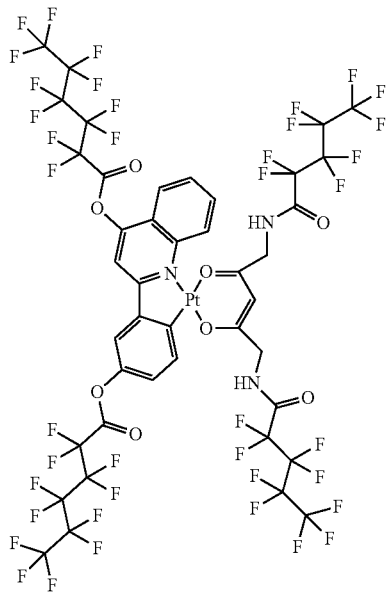

(Chemical Formula 13)

The respective materials were adjusted to 100:10:0.5:0.5 in terms of ratio by weight. A coating liquid was prepared by dissolving the host, and the blue, red, and green dopants in toluene. This coating liquid was used to form an organic light-emitting layer by a spin coat method. Subsequently, as the electron transport layer, a layer of UGH2 and 3TPYMB was formed by a vacuum deposition method. Next, a laminated body of LiF and Al was formed as an upper electrode to prepare the intended organic light-emitting element. The light-emitting positions were adjusted near 75 nm from the upper electrode for each color dopant.

When a voltage was applied to the prepared organic light-emitting element, luminescence from the three dopants was confirmed from the EL spectrum, thereby succeeding the confirmation of a white light emission. In addition, as Comparative Example 6, an element was prepared with the use of dopants with no functional groups added thereto. Example 6 exhibited 1.30 times as high luminous efficiency as compared with Comparative Example 6. Further, when a light-emitting layer configured as in Example 6 was separately manufactured by way of trial to measure the angle dependence of P polarization intensity in a photoluminescence measurement and figure out the proportions of components constituting the transition dipole moments for each color dopant, the horizontal component was 85% or more for each of the colors. On the other hand, in Comparative Example 6, the horizontal component was 50% for each of the colors.

It is to be noted that as described in the previous section of this specification, when the transition dipole moment is directionally isotropic, approximately 75% of the exciton energy is converted into visible light, whereas 25% thereof results in a loss derived from surface plasmon polariton. Accordingly, the luminous efficiency in Example 6 with the directionally substantially horizontal transition dipole moment, which is 1.30 (<(25+75)/75≈1.33) times as high as that in Comparative Example 1 with the directionally isotropic transition dipole moment, is believed to be because most of the loss due to surface plasmon polariton is converted into visible light. This has an adequately large value which is close to the upper limit as an improvement in efficiency.

Example 7

A light source device with a plurality of organic light-emitting elements connected was prepared as a seventh example of the present invention. For the prepared elements with the same layer configuration as in Example 1, elements (RG elements) containing, in their light-emitting layers, a host, the (Chemical Formula 12) as the red dopant, and the (Chemical Formula 14) as the green dopant, and elements (B elements) containing, in their light-emitting layers, a host and the (Chemical Formula 9) as the blue dopant were separately created in the plane, and connected in series and in parallel with each other. For the preparation of the applied films, an ink-jet method was used. The light-emitting positions were adjusted near 75 nm from the upper electrode for each color dopant.

[Chemical Formula 14]

(Chemical Formula 14)

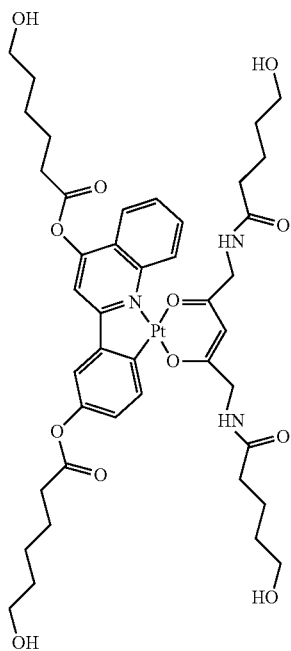

In order to obtain homogeneous white light, a diffuser plate was attached to the light-emitting surfaces of the prepared elements. The prepared light source device achieved favorable white light. In addition, as Comparative Example 7, an element was prepared with the use of dopants with no functional groups added thereto. Example 7 exhibited 1.22 times as high luminous efficiency as compared with Comparative Example 7. Further, when a light-emitting layer configured as in Example 2 was separately manufactured by way of trial to measure the angle dependence of P polarization intensity in a photoluminescence measurement and figure out the proportions of components constituting the transition dipole moments for each color dopant, the horizontal component was 83% or more for each of the colors. On the other hand, in Comparative Example 7, the horizontal component was approximately 50% for each of the colors.

The luminous efficiency which is 1.22 times as high as in Example 6 is believed to be because a significant proportion of the loss due to surface plasmon polariton is converted into visible light, and has an adequately large value as an improvement in efficiency.

In addition, the attachment of the diffuser plate can extract, to the outside (air), more of visible light generated by the conversion from exciton energy in the light-emitting layers. Accordingly, the efficiency improvement effect achieved by the directionally substantially horizontal transition dipole moment can be further amplified to achieve a light source device with a higher luminous efficiency.

Example 8

A light source device with a plurality of organic light-emitting elements connected was prepared as an eighth example of the present invention. For the prepared elements with the same layer configuration as in Example 6, elements (R elements) containing, in their light-emitting layers, a host and the (Chemical Formula 12) as the red dopant, elements (G elements) containing, in their light-emitting layers, a host material and the (Chemical Formula 13) as the green dopant, and elements (B elements) containing, in their light-emitting layers, a host and the (Chemical Formula 9) as the blue dopant were separately created in the plane, and connected in series and in parallel with each other. For the preparation of the applied films, an ink-jet method was used. The light-emitting positions were adjusted near 75 nm from the upper electrode for each color dopant. In order to obtain homogeneous white light, a diffuser plate was attached to the light-emitting surfaces of the prepared elements. The prepared light source device achieved favorable white light. In addition, as Comparative Example 8, an element was prepared with the use of dopants with no functional groups added thereto. Example 8 exhibited 1.20 times as high luminous efficiency as compared with Comparative Example 8. Further, when a light-emitting layer configured as in Example 8 was separately manufactured by way of trial to measure the angle dependence of P polarization intensity in a photoluminescence measurement and figure out the proportions of components constituting the transition dipole moments for each color dopant, the horizontal component was 88% or more for each of the colors. On the other hand, in Comparative Example 8, the horizontal component was approximately 50% for each of the colors.

The luminous efficiency which is 1.20 times as high as in Example 6 is believed to be because a significant proportion of the loss due to surface plasmon polariton is converted into visible light, and has an adequately large value as an improvement in efficiency.

In addition, the attachment of the diffuser plate can extract, to the outside (air), more of visible light generated by the conversion from exciton energy in the light-emitting layers. Accordingly, the efficiency improvement effect achieved by the directionally substantially horizontal transition dipole moment can be further amplified to achieve a light source device with a higher luminous efficiency.

It is to be noted that in Examples 6 to 8, due to the dopant in the light-emitting layer 303, which includes one or more functional groups selected from, for example, a fluoroalkyl group, a perfluoroalkyl group, an alkyl group (the number of C is 10 or more), a perfluoropolyether group, and a siloxy group, the concentration of the dopant in the light-emitting layer 303 is higher in a region of the light-emitting layer 303 with the electron transport layer 304 and upper electrode 102 closer thereto than in a region of the light-emitting layer 303 with the electron transport layer 304 and upper electrode 102 farther therefrom. This is caused by the movement of the dopant to the region of the light-emitting layer 303 with the electron transport layer 304 and upper electrode 102 closer thereto.

In addition, in Examples 6 to 8, due to the dopant in the light-emitting layer 303, which includes one or more functional groups selected from, for example, —OH, —SH, —COOH, —SO₃H, I, Br, Cl, F, SCN, CN, NH₂, NO₂, and a bipyridyl group, a phenylamino group, an oxazole group, a carbazole group, and a hydrazone moiety, the concentration of the dopant in the light-emitting layer 303 is higher in a region of the light-emitting layer 303 with the hole transport layer 302 and lower electrode 101 closer thereto than in a region of the light-emitting layer 303 with the hole transport layer 302 and lower electrode 101 farther therefrom. This is caused by the movement of the dopant to the region of the light-emitting layer 303 with the hole transport layer 302 and lower electrode 101 closer thereto.

The region of the light-emitting layer 303 with the electron transport layer 304 and upper electrode 102 closer thereto refers herein to a region from the center to the end in a direction toward the electron transport layer 304 and upper electrode 102 each located. The region of the light-emitting layer 303 with the electron transport layer 304 and upper electrode 102 farther therefrom refers to a region from the center to the end in a direction opposite to the direction toward the electron transport layer 304 and upper electrode 102 each located.

In addition, the region of the light-emitting layer 303 with the hole transport layer 302 and lower electrode 101 closer thereto refers to a region from the center to the end in a direction toward the hole transport layer 302 and lower electrode 101 each located. In addition, the region of the light-emitting layer 303 with the hole transport layer 302 and lower electrode 101 farther therefrom refers to a region from the center to the end in a direction opposite to the direction toward the hole transport layer 302 and lower electrode 101 each located.

Example 9

The light source device shown in FIG. 5 was prepared as an example of the present invention. An organic light-emitting element as a component of the light source device is composed of a substrate 100, a lower electrode 101, an organic layer 103, and an upper electrode 102 as in the case of Example 1. The organic light-emitting element is sealed with a sealing tube glass 501 with a desiccant agent so as to cut off the organic layer 103 from the outside air. In addition, the lower electrode 101 and the upper electrode 102 are each connected through a wiring 502 to a driving circuit 503. Further, the organic light-emitting element with the sealing tube glass 501 and the driving circuit 503 are covered with a housing 505 to serve as the light source device 506 as a whole. It is to be noted that the device is lighted up by connecting the driving circuit 503 through a plug 504 to an external power supply. In the case of the preparation of a light source device A with the use of the organic light-emitting element according to Example 1 and a light source device B with the use of the organic light-emitting element according to Comparative Example 1, the light source device A succeeded in lowering the power consumption by 23% with respect to the light source device B.

REFERENCE SIGNS LIST

100 substrate
101 lower electrode
102 upper electrode
103 organic layer
104 first bank
105 second bank
106 resin layer
107 sealing substrate
201 diffuser plate
202 first organic light-emitting element
203 second organic light-emitting element
301 hole injection layer
302 hole transport layer
303 light-emitting layer
304 electron transport layer
305 electron injection layer
501 sealing tube glass
502 wiring
503 driving circuit
504 plug
505 housing
506 light source device

The invention claimed is:

1. An organic light-emitting element comprising:
   a lower electrode and an upper electrode, one of the electrode serving as a reflective electrode, and the other thereof serving as a transparent electrode; and
   a light-emitting layer placed between the lower electrode and the upper electrode, the light-emitting layer containing a host and a first dopant,
   wherein the first dopant contains a first functional group,
   for the first dopant, one of a vertical component and a horizontal component of an average value for transition dipole moments with respect to a substrate surface is larger than the other of the components, and
   the concentration of the first dopant is higher in either one of: a region of the light-emitting layer with the upper electrode closer thereto; and a region thereof with the lower electrode closer thereto, than in the other of the regions.

2. The organic light-emitting element according to claim 1,
   wherein the dopant contained in the light-emitting layer has planar molecules,
   one of a vertical component and a horizontal component of an average value for the planar molecules with respect to the substrate surface is larger than the other of the components.

3. The organic light-emitting element according to claim 1,
   wherein the dopant contained in the light-emitting layer has rod-like molecules,
   one of a vertical component and a horizontal component of an average value for long axes of the rod-like molecules with respect to the substrate surface is larger than the other of the components.

4. The organic light-emitting element according to claim 1,
   wherein for the first dopant, one of the vertical component and horizontal component of the average value for transition dipole moments with respect to the substrate surface is 60% or more.

5. An organic light-emitting element comprising:
   a reflective electrode;
   a transparent electrode; and
   a light-emitting layer placed between the reflective electrode and the transparent electrode,
   wherein the light-emitting layer contains a host and a first dopant,
   for the first dopant, a vertical component of an average value for transition dipole moments with respect to a substrate surface is larger than a horizontal component thereof, and
   the reflective electrode has a concave-convex structure on a side closer to the light-emitting layer.

6. The organic light-emitting element according to claim 5,
   wherein the first dopant contains a first functional group, and
   the concentration of the first dopant is higher in either one of: a region of the light-emitting layer with the reflective electrode closer thereto; and a region thereof with the transparent electrode closer thereto, than in the other of the regions.

7. The organic light-emitting element according to claim 5,
   wherein the light-emitting layer contains a second dopant,
   the second dopant has a luminescent color different from that of the first dopant, and for the second dopant, a vertical component of an average value for transition dipole moments with respect to the substrate surface is larger than a horizontal component thereof.

8. The organic light-emitting element according to claim 7, wherein the light-emitting layer contains a third dopant, the third dopant has a luminescent color different from those of the first dopant and second dopant, and for the third dopant, a vertical component of an average value for transition dipole moments with respect to the substrate surface is larger than a horizontal component thereof.

9. The organic light-emitting element according to claim 5, wherein for the first dopant, the vertical component of the average value for transition dipole moments with respect to the substrate surface is 60% or more.

10. The organic light-emitting element according to claim 5, wherein any one of the dopants contained in the light-emitting layer has planar molecules, and a vertical component of an average value for the planar molecules with respect to the substrate surface is larger than a horizontal component thereof.

11. The organic light-emitting element according to claim 5, wherein any one of the dopants contained in the light-emitting layer has rod-like molecules, and a vertical component of an average value for long axes of the rod-like molecules with respect to the substrate surface is larger than a horizontal component thereof.

12. The organic light-emitting element according to claim 5, wherein the concave-convex structure contains Ag, Au, Cu, or Al as its main constituent.

13. The organic light-emitting element according to claim 5, wherein the concave-convex structure has a concave-convex height, width, and pitch smaller than an emission wavelength.

14. The organic light-emitting element according to claim 13, wherein the concave-convex height falls within the range of 40 to 120 nm.

15. The organic light-emitting element according to claim 5, wherein the organic light-emitting element has a light extraction layer on the side opposite to the location of the reflective electrode from the transparent electrode.

16. An organic light-emitting element comprising:
an upper electrode;
a lower electrode; and
a light-emitting layer placed between the upper electrode and the lower electrode,
wherein the light-emitting layer contains a host and a first dopant,
the first dopant contains a first functional group,
the concentration of the first dopant is higher in either one of: a region of the light-emitting layer with the upper electrode closer thereto; and a region thereof with the lower electrode closer thereto, than in the other of the regions, and
for the first dopant, a horizontal component of an average value for transition dipole moments with respect to a substrate surface is larger than a vertical component thereof.

17. The organic light-emitting element according to claim 16, wherein the light-emitting layer contains a second dopant, the second dopant has a luminescent color different from that of the first dopant,
the second dopant contains a second functional group,
the concentration of the second dopant is higher in either one of: a region of the light-emitting layer with the upper electrode closer thereto; and a region thereof with the lower electrode closer thereto, than in the other of the regions, and
for the second dopant, a horizontal component of an average value for transition dipole moments with respect to the substrate surface is larger than a vertical component thereof.

18. The organic light-emitting element according to claim 17, wherein the light-emitting layer contains a third dopant, the third dopant has a luminescent color different from those of the first dopant and the second dopant,
the third dopant contains a third functional group,
the concentration of the third dopant is higher in either one of: a region of the light-emitting layer with the upper electrode closer thereto; and a region thereof with the lower electrode closer thereto, than in the other of the regions, and
for the third dopant, a horizontal component of an average value for transition dipole moments with respect to the substrate surface is larger than a vertical component thereof.

19. The organic light-emitting element according to claim 16, wherein for the first dopant, the horizontal component of the average value for transition dipole moments with respect to the substrate surface is 60% or more.

20. The organic light-emitting element according to claim 16, wherein any one of the dopants contained in the light-emitting layer has planar molecules, and a horizontal component of an average value for the planar molecules with respect to the substrate surface is larger than a vertical component thereof.

21. The organic light-emitting element according to claim 16, wherein any one of the dopants contained in the light-emitting layer has rod-like molecules, and a horizontal component of an average value for long axes of the rod-like molecules with respect to the substrate surface is larger than a vertical component thereof.

22. The organic light-emitting element according to claim 1, wherein the first functional group is one or more selected from a fluoroalkyl group, a perfluoroalkyl group, an alkyl group a number of C that is 10 or more, a perfluoropolyether group, and a siloxy group, and —OH, —SH, —COOH, —SO$_3$H, I, Br, Cl, F, SCN, CN, NH$_2$, NO$_2$, and a bipyridyl group, a phenylamino group, an oxazole group, a carbazole group, and a hydrazone moiety.

23. The organic light-emitting element according to claim 1, wherein the first dopant is a metal complex including a four-coordinated central metal.

24. The organic light-emitting element according to claim 23, wherein the first dopant is represented by a general formula (1):

General Formula (1)

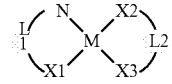

wherein in the general formula (1), N-L1-X1 and X2-L2-X3 each represent a bidentate ligand, X1, X2, and X3 each independently represent a carbon atom, an oxygen atom, or a nitrogen atom, L1 and L2 represent groups of atoms that respectively form bidentate ligands along with N and X1 and X2 and X3, and the central metal M represents Ni, Pd, Pt, Au, Ag, Rh, or Ir.

25. A light source device comprising the organic light-emitting element according to claim 1.

26. A method of manufacturing an organic light-emitting element comprising a reflective electrode, a transparent electrode, and a light-emitting layer placed between the reflective electrode and the transparent electrode,
wherein the light-emitting layer contains a host and a first dopant,
for the first dopant, a vertical component of an average value for transition dipole moments with respect to a substrate surface is larger than a horizontal component thereof,
the light-emitting layer is prepared by coating, and
a concave-convex structure is formed on a side of the reflective electrode closer to the light-emitting layer.

27. A light source device comprising a first organic light-emitting element and a second organic light-emitting element,
wherein the first organic light-emitting element and the second organic light-emitting element each comprises a reflective electrode, a transparent electrode, and a light-emitting layer placed between the reflective electrode and the transparent electrode,
the light-emitting layer of the first organic light-emitting element contains a first host and a first dopant,
the light-emitting layer of the second organic light-emitting element contains a second host, a second dopant, and a third dopant,
for the first dopant, the second dopant, and the third dopant, vertical components of average values for transition dipole moments with respect to a substrate surface is larger than horizontal components thereof, and
the light source device comprises a concave-convex structure on a side of the reflective electrode closer to the light-emitting layer.

28. A method of manufacturing an organic light-emitting element comprising an upper electrode, a lower electrode, and a light-emitting layer placed between the upper electrode and the lower electrode,
wherein the light-emitting layer contains a host and a first dopant,
the first dopant contains a first functional group,
the concentration of the first dopant is higher in either one of: a region of the light-emitting layer with the upper electrode closer thereto; and a region thereof with the lower electrode closer thereto, than in the other of the regions,
for the first dopant, a horizontal component of an average value for transition dipole moments with respect to a substrate surface is larger than a vertical component thereof, and
the light-emitting layer is prepared by coating.

29. A light source device comprising a first organic light-emitting element and a second organic light-emitting element,
wherein the first organic light-emitting element and the second organic light-emitting element each comprises an upper electrode, a lower electrode, and a light-emitting layer placed between the upper electrode and the lower electrode,
the light-emitting layer of the first organic light-emitting element contains a host and a first dopant,
the light-emitting layer of the second organic light-emitting element contains a host, a second dopant, and a third dopant
the first dopant contains a first functional group,
the second dopant contains a second functional group,
the third dopant contains a third functional group,
the concentrations of the first dopant, second dopant, and third dopant are higher in either one of: a region of the light-emitting layer with the upper electrode closer thereto; and a region thereof with the lower electrode closer thereto, than in the other of the regions, and
for the first dopant, the second dopant, and the third dopant, horizontal components of average values for transition dipole moments with respect to a substrate surface is larger than vertical components thereof.

30. The light source device according to claim 27, wherein the first dopant is a blue dopant, and
one of the second dopant and the third dopant is a red dopant, whereas the other thereof is a green dopant.

* * * * *